United States Patent
Ryu et al.

(10) Patent No.: US 9,112,759 B2
(45) Date of Patent: Aug. 18, 2015

(54) ADAPTIVE LNA OPERATION FOR SHARED LNA RECEIVER FOR CARRIER AGGREGATION

(71) Applicant: QUALCOMM Incorporated, San Diego, CA (US)

(72) Inventors: Jae Ho Ryu, San Diego, CA (US); Tingfang Ji, San Diego, CA (US); Valentin Alexandru Gheorghiu, Tokyo (JP)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/498,788

(22) Filed: Sep. 26, 2014

(65) Prior Publication Data
US 2015/0098532 A1    Apr. 9, 2015

Related U.S. Application Data

(60) Provisional application No. 61/887,276, filed on Oct. 4, 2013.

(51) Int. Cl.
*H04B 7/10* (2006.01)
*H04L 27/26* (2006.01)
*H03G 3/20* (2006.01)

(52) U.S. Cl.
CPC .............. *H04L 27/2647* (2013.01); *H03G 3/20* (2013.01)

(58) Field of Classification Search
None
See application file for complete search history.

(56) References Cited

U.S. PATENT DOCUMENTS

2012/0057547 A1*  3/2012  Lohr et al. ................. 370/329
2012/0300667 A1  11/2012  Dalsgaard et al.
2013/0195084 A1   8/2013  Chen et al.

FOREIGN PATENT DOCUMENTS

| WO | 2011085191 A1 | 7/2011 |
| WO | 2011120716 A1 | 10/2011 |
| WO | 2012078565 A1 | 6/2012 |

OTHER PUBLICATIONS

Ericsson et al., "Considerations on Performance Requirement for Intra-Band Non-Contigugous CA," 3GPP TSG-RAN WG4 Meeting #68, R4-133759, 2013, 4 pages.
International Search Report and Written Opinion—PCT/US2014/058058—ISA/EPO—Jan. 16, 2015.
Qualcomm Incorporated: "Receiver Timing Window Requirement for Intraband Non-Contiguous CA," 3GPP TSG-RAN WG4 #68bis, R4-134774, 2013, 3 Pages.

* cited by examiner

*Primary Examiner* — Adolf Dsouza
(74) *Attorney, Agent, or Firm* — Arent Fox LLP

(57) ABSTRACT

A method, an apparatus, and a computer program product for wireless communication are provided. The apparatus determines whether a timing offset between a PCC and an SCC possibly exceeds a threshold. In addition, the apparatus switches an amplifier gain utilizing one of a first set of gain states or a second set of gain states based on the determination that the timing offset possibly exceeds the threshold. The first set of gain states includes a first number of gain states, and the second set of gain states includes a second number of gain states less than the first number of gain states.

30 Claims, 14 Drawing Sheets

ADAPTIVE LNA OPERATION FOR SHARED LNA RECEIVER FOR CARRIER AGGREGATION

CROSS-REFERENCE TO RELATED APPLICATION(S)

This application claims the benefit of U.S. Provisional Application Ser. No. 61/887,276, entitled "ADPTIVE LNA OPERATION FOR SHARED LNA RECEIVER FOR CARRIER AGGREGATION" and filed on Oct. 4, 2013, which is expressly incorporated by reference herein in its entirety.

BACKGROUND

1. Field

The present disclosure relates generally to communication systems, and more particularly, to an adaptive low noise amplifier (LNA) operation for a receiver architecture with a shared LNA for carrier aggregation.

2. Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example of an emerging telecommunication standard is Long Term Evolution (LTE). LTE is a set of enhancements to the Universal Mobile Telecommunications System (UMTS) mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA on the downlink (DL), SC-FDMA on the uplink (UL), and multiple-input multiple-output (MIMO) antenna technology. However, as the demand for mobile broadband access continues to increase, there exists a need for further improvements in LTE technology. Preferably, these improvements should be applicable to other multi-access technologies and the telecommunication standards that employ these technologies.

SUMMARY

In an aspect of the disclosure, a method, a computer program product, and an apparatus are provided. The apparatus for amplifier gain switching determines whether a timing offset between a primary component carrier (PCC) and a secondary component carrier (SCC) possibly exceeds a threshold. In addition, the apparatus switches an amplifier gain utilizing one of a first set of gain states or a second set of gain states based on the determination that the timing offset possibly exceeds the threshold. The first set of gain states includes a first number of gain states and the second set of gain states includes a second number of gain states less than the first number of gain states.

DETAILED DESCRIPTION

Figure 1:
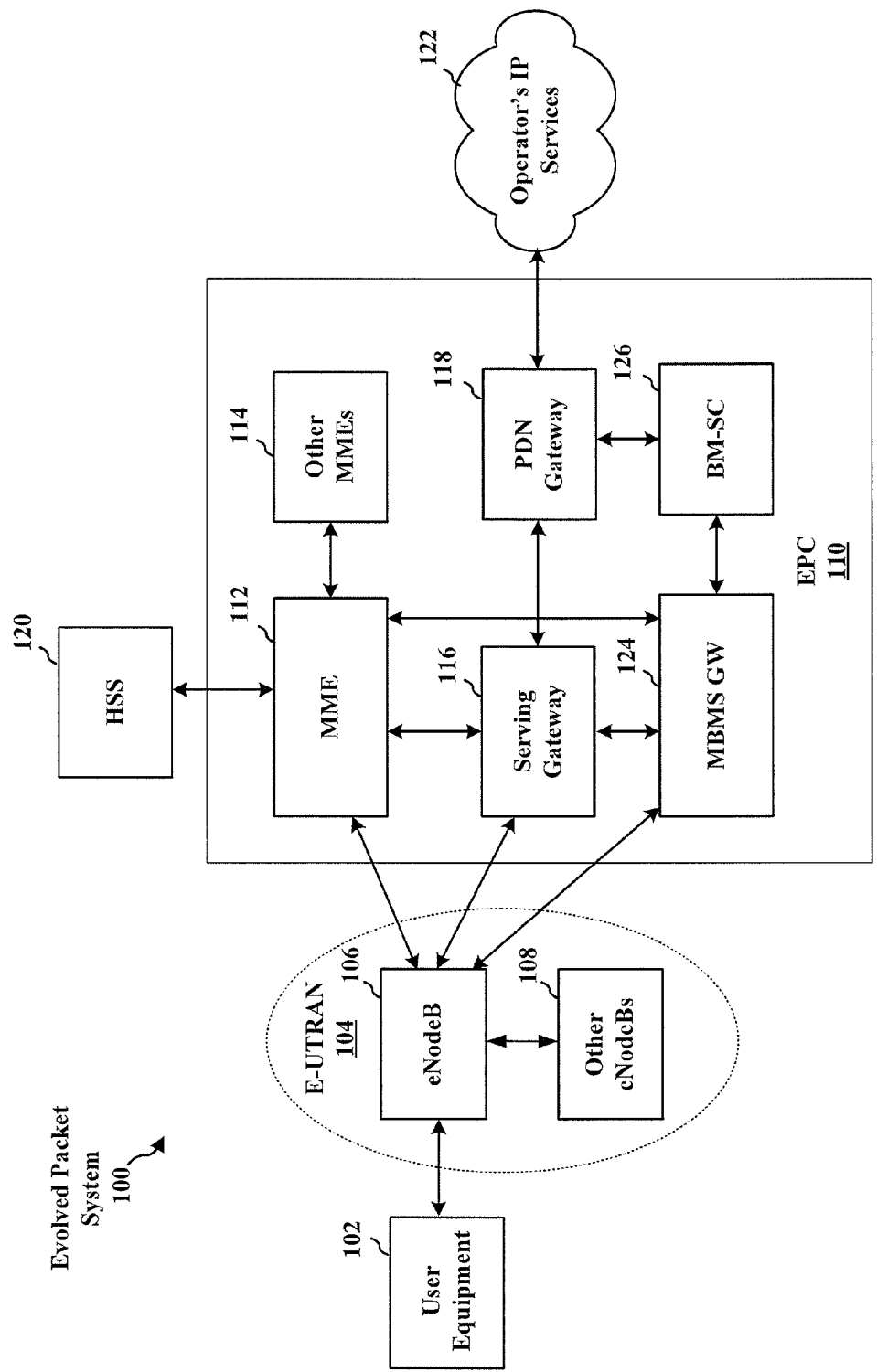
FIG. 1 is a diagram illustrating an example of a network architecture.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), compact disk ROM (CD-ROM) or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

FIG. 1 is a diagram illustrating an LTE network architecture 100. The LTE network architecture 100 may be referred to as an Evolved Packet System (EPS) 100. The EPS 100 may include one or more user equipment (UE) 102, an Evolved UMTS Terrestrial Radio Access Network (E-UTRAN) 104, an Evolved Packet Core (EPC) 110, a Home Subscriber Server (HSS) 120, and an Operator's Internet Protocol (IP) Services 122. The EPS can interconnect with other access networks, but for simplicity those entities/interfaces are not shown. As shown, the EPS provides packet-switched services, however, as those skilled in the art will readily appreciate, the various concepts presented throughout this disclosure may be extended to networks providing circuit-switched services.

The E-UTRAN includes the evolved Node B (eNB) 106 and other eNBs 108. The eNB 106 provides user and control planes protocol terminations toward the UE 102. The eNB 106 may be connected to the other eNBs 108 via a backhaul (e.g., an X2 interface). The eNB 106 may also be referred to as a base station, a Node B, an access point, a base transceiver station, a radio base station, a radio transceiver, a transceiver function, a basic service set (BSS), an extended service set (ESS), or some other suitable terminology. The eNB 106 provides an access point to the EPC 110 for a UE 102. Examples of UEs 102 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, or any other similar functioning device. The UE 102 may also be referred to by those skilled in the art as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

The eNB 106 is connected to the EPC 110. The EPC 110 may include a Mobility Management Entity (MME) 112, other MMEs 114, a Serving Gateway 116, a Multimedia Broadcast Multicast Service (MBMS) Gateway 124, a Broadcast Multicast Service Center (BM-SC) 126, and a Packet Data Network (PDN) Gateway 118. The MME 112 is the control node that processes the signaling between the UE 102 and the EPC 110. Generally, the MME 112 provides bearer and connection management. All user IP packets are transferred through the Serving Gateway 116, which itself is connected to the PDN Gateway 118. The PDN Gateway 118 provides UE IP address allocation as well as other functions. The PDN Gateway 118 is connected to the Operator's IP Services 122. The Operator's IP Services 122 may include the Internet, an intranet, an IP Multimedia Subsystem (IMS), and a PS Streaming Service (PSS). The BM-SC 126 may provide functions for MBMS user service provisioning and delivery. The BM-SC 126 may serve as an entry point for content provider MBMS transmission, may be used to authorize and initiate MBMS Bearer Services within a public land mobile network (PLMN), and may be used to schedule and deliver MBMS transmissions. The MBMS Gateway 124 may be used to distribute MBMS traffic to the eNBs (e.g., 106, 108) belonging to a Multicast Broadcast Single Frequency Network (MBSFN) area broadcasting a particular service, and may be responsible for session management (start/stop) and for collecting eMBMS related charging information.

Figure 2:
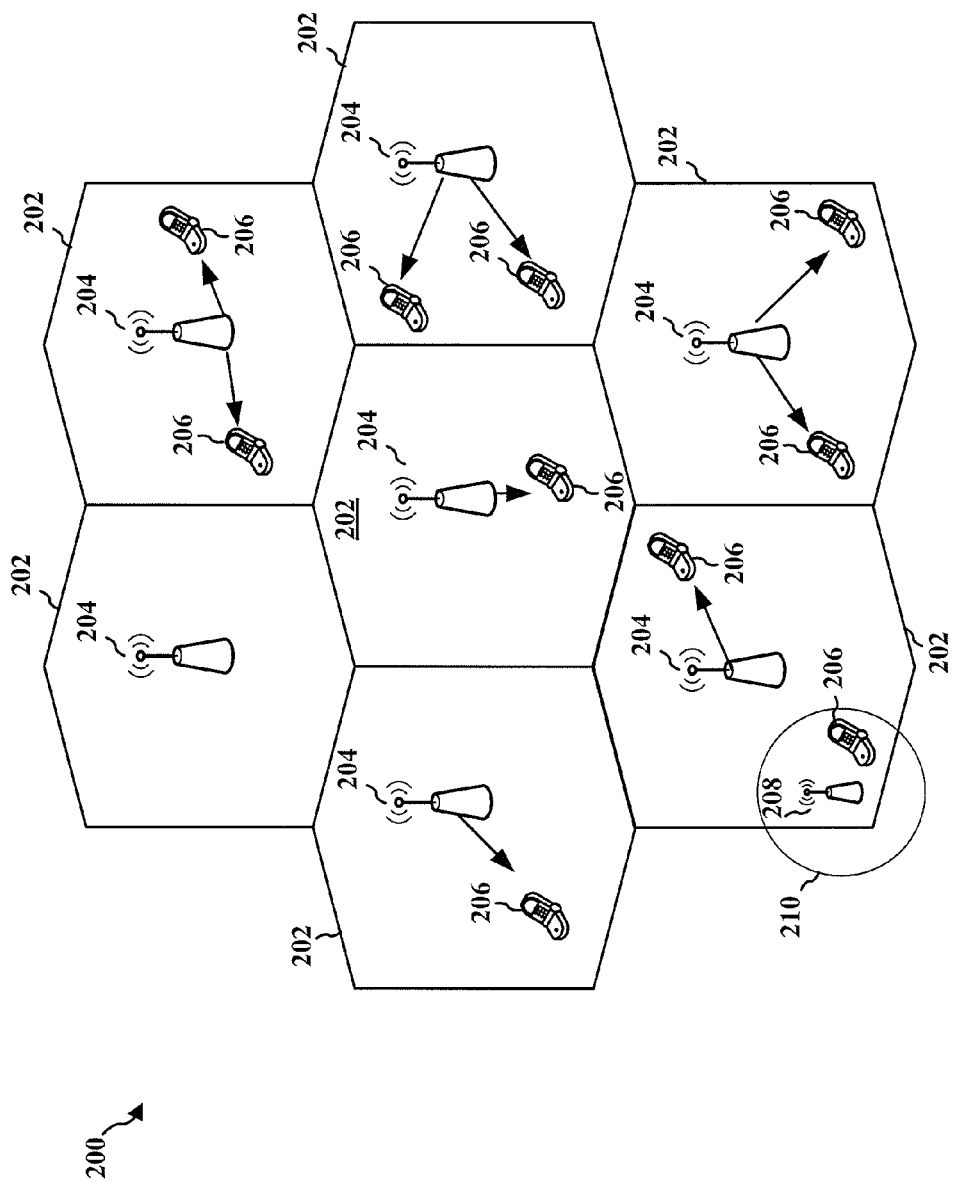
FIG. 2 is a diagram illustrating an example of an access network.

FIG. 2 is a diagram illustrating an example of an access network 200 in an LTE network architecture. In this example, the access network 200 is divided into a number of cellular regions (cells) 202. One or more lower power class eNBs 208 may have cellular regions 210 that overlap with one or more of the cells 202. The lower power class eNB 208 may be a femto cell (e.g., home eNB (HeNB)), pico cell, micro cell, or remote radio head (RRH). The macro eNBs 204 are each assigned to a respective cell 202 and are configured to provide an access point to the EPC 110 for all the UEs 206 in the cells 202. There is no centralized controller in this example of an access network 200, but a centralized controller may be used in alternative configurations. The eNBs 204 are responsible for all radio related functions including radio bearer control, admission control, mobility control, scheduling, security, and connectivity to the serving gateway 116. An eNB may support one or multiple (e.g., three) cells (also referred to as a sector). The term "cell" can refer to the smallest coverage area of an eNB and/or an eNB subsystem serving are particular coverage area. Further, the terms "eNB," "base station," and "cell" may be used interchangeably herein.

The modulation and multiple access scheme employed by the access network 200 may vary depending on the particular telecommunications standard being deployed. In LTE applications, OFDM is used on the DL and SC-FDMA is used on the UL to support both frequency division duplex (FDD) and time division duplex (TDD). As those skilled in the art will readily appreciate from the detailed description to follow, the various concepts presented herein are well suited for LTE applications. However, these concepts may be readily extended to other telecommunication standards employing other modulation and multiple access techniques. By way of example, these concepts may be extended to Evolution-Data Optimized (EV-DO) or Ultra Mobile Broadband (UMB). EV-DO and UMB are air interface standards promulgated by the 3rd Generation Partnership Project 2 (3GPP2) as part of the CDMA2000 family of standards and employs CDMA to provide broadband Internet access to mobile stations. These concepts may also be extended to Universal Terrestrial Radio Access (UTRA) employing Wideband-CDMA (W-CDMA) and other variants of CDMA, such as TD-SCDMA; Global System for Mobile Communications (GSM) employing TDMA; and Evolved UTRA (E-UTRA), IEEE 802.11 (Wi-Fi), IEEE 802.16 (WiMAX), IEEE 802.20, and Flash-OFDM employing OFDMA. UTRA, E-UTRA, UMTS, LTE and GSM are described in documents from the 3GPP organization. CDMA2000 and UMB are described in documents from the 3GPP2 organization. The actual wireless communication standard and the multiple access technology employed will depend on the specific application and the overall design constraints imposed on the system.

The eNBs 204 may have multiple antennas supporting MIMO technology. The use of MIMO technology enables the eNBs 204 to exploit the spatial domain to support spatial multiplexing, beamforming, and transmit diversity. Spatial multiplexing may be used to transmit different streams of data simultaneously on the same frequency. The data streams may be transmitted to a single UE 206 to increase the data rate or to multiple UEs 206 to increase the overall system capacity. This is achieved by spatially precoding each data stream (i.e., applying a scaling of an amplitude and a phase) and then transmitting each spatially precoded stream through multiple transmit antennas on the DL. The spatially precoded data streams arrive at the UE(s) 206 with different spatial signatures, which enables each of the UE(s) 206 to recover the one or more data streams destined for that UE 206. On the UL, each UE 206 transmits a spatially precoded data stream, which enables the eNB 204 to identify the source of each spatially precoded data stream.

Spatial multiplexing is generally used when channel conditions are good. When channel conditions are less favorable, beamforming may be used to focus the transmission energy in one or more directions. This may be achieved by spatially precoding the data for transmission through multiple antennas. To achieve good coverage at the edges of the cell, a single stream beamforming transmission may be used in combination with transmit diversity.

In the detailed description that follows, various aspects of an access network will be described with reference to a MIMO system supporting OFDM on the DL. OFDM is a spread-spectrum technique that modulates data over a number of subcarriers within an OFDM symbol. The subcarriers are spaced apart at precise frequencies. The spacing provides "orthogonality" that enables a receiver to recover the data from the subcarriers. In the time domain, a guard interval (e.g., cyclic prefix) may be added to each OFDM symbol to combat inter-OFDM-symbol interference. The UL may use SC-FDMA in the form of a DFT-spread OFDM signal to compensate for high peak-to-average power ratio (PAPR).

Figure 3:
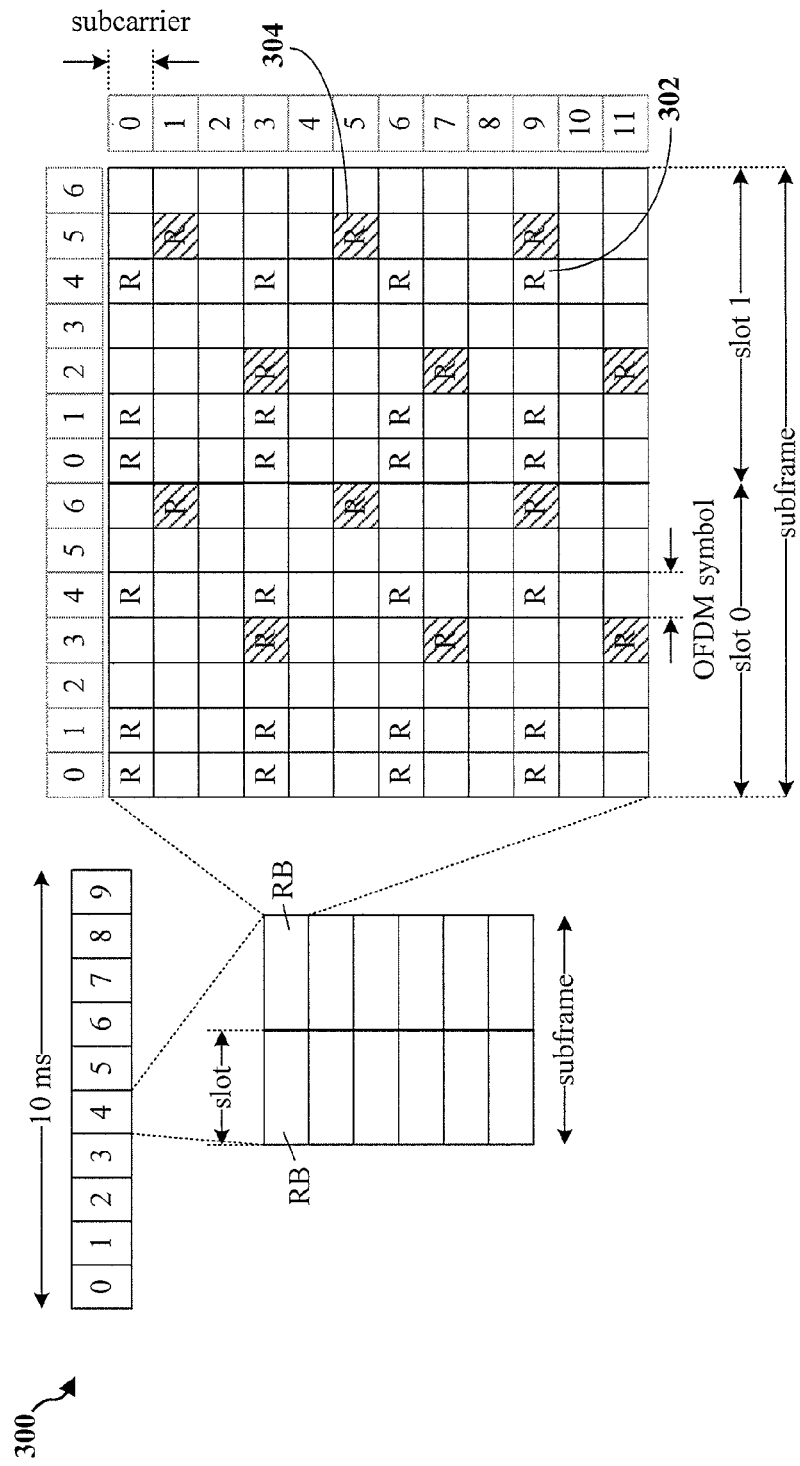
FIG. 3 is a diagram illustrating an example of a DL frame structure in LTE.

FIG. 3 is a diagram 300 illustrating an example of a DL frame structure in LTE. A frame (10 ms) may be divided into 10 equally sized subframes. Each subframe may include two consecutive time slots. A resource grid may be used to represent two time slots, each time slot including a resource block. The resource grid is divided into multiple resource elements. In LTE, a resource block contains 12 consecutive subcarriers in the frequency domain and, for a normal cyclic prefix in each OFDM symbol, 7 consecutive OFDM symbols in the time domain, or 84 resource elements. For an extended cyclic prefix, a resource block may contain 6 consecutive OFDM symbols in the time domain, or 72 resource elements. Some of the resource elements, indicated as R 302, 304, include DL reference signals (DL-RS). The DL-RS include Cell-specific RS (CRS) (also sometimes called common RS) 302 and UE-specific RS (UE-RS) 304. UE-RS 304 are transmitted only on the resource blocks upon which the corresponding physical DL shared channel (PDSCH) is mapped. The number of bits carried by each resource element depends on the modulation scheme. Thus, the more resource blocks that a UE receives and the higher the modulation scheme, the higher the data rate for the UE.

Figure 4:
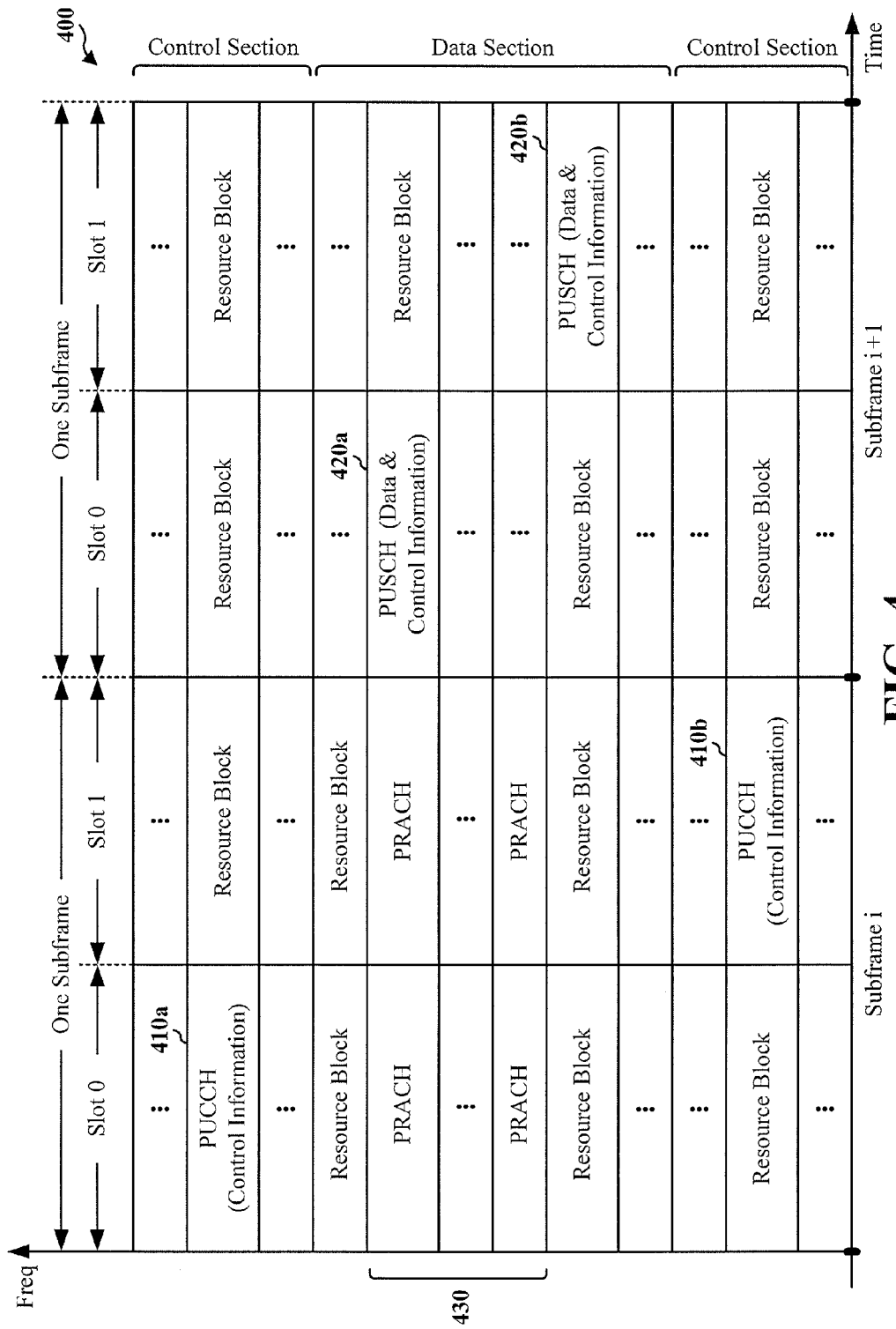
FIG. 4 is a diagram illustrating an example of an UL frame structure in LTE.

FIG. 4 is a diagram 400 illustrating an example of an UL frame structure in LTE. The available resource blocks for the UL may be partitioned into a data section and a control section. The control section may be formed at the two edges of the system bandwidth and may have a configurable size. The resource blocks in the control section may be assigned to UEs for transmission of control information. The data section may include all resource blocks not included in the control section. The UL frame structure results in the data section including contiguous subcarriers, which may allow a single UE to be assigned all of the contiguous subcarriers in the data section.

A UE may be assigned resource blocks 410a, 410b in the control section to transmit control information to an eNB. The UE may also be assigned resource blocks 420a, 420b in the data section to transmit data to the eNB. The UE may transmit control information in a physical UL control channel (PUCCH) on the assigned resource blocks in the control section. The UE may transmit only data or both data and control information in a physical UL shared channel (PUSCH) on the assigned resource blocks in the data section. A UL transmission may span both slots of a subframe and may hop across frequency.

A set of resource blocks may be used to perform initial system access and achieve UL synchronization in a physical random access channel (PRACH) 430. The PRACH 430 carries a random sequence and cannot carry any UL data/signaling. Each random access preamble occupies a bandwidth corresponding to six consecutive resource blocks. The starting frequency is specified by the network. That is, the transmission of the random access preamble is restricted to certain time and frequency resources. There is no frequency hopping for the PRACH. The PRACH attempt is carried in a single subframe (1 ms) or in a sequence of few contiguous subframes and a UE can make only a single PRACH attempt per frame (10 ms).

Figure 5:
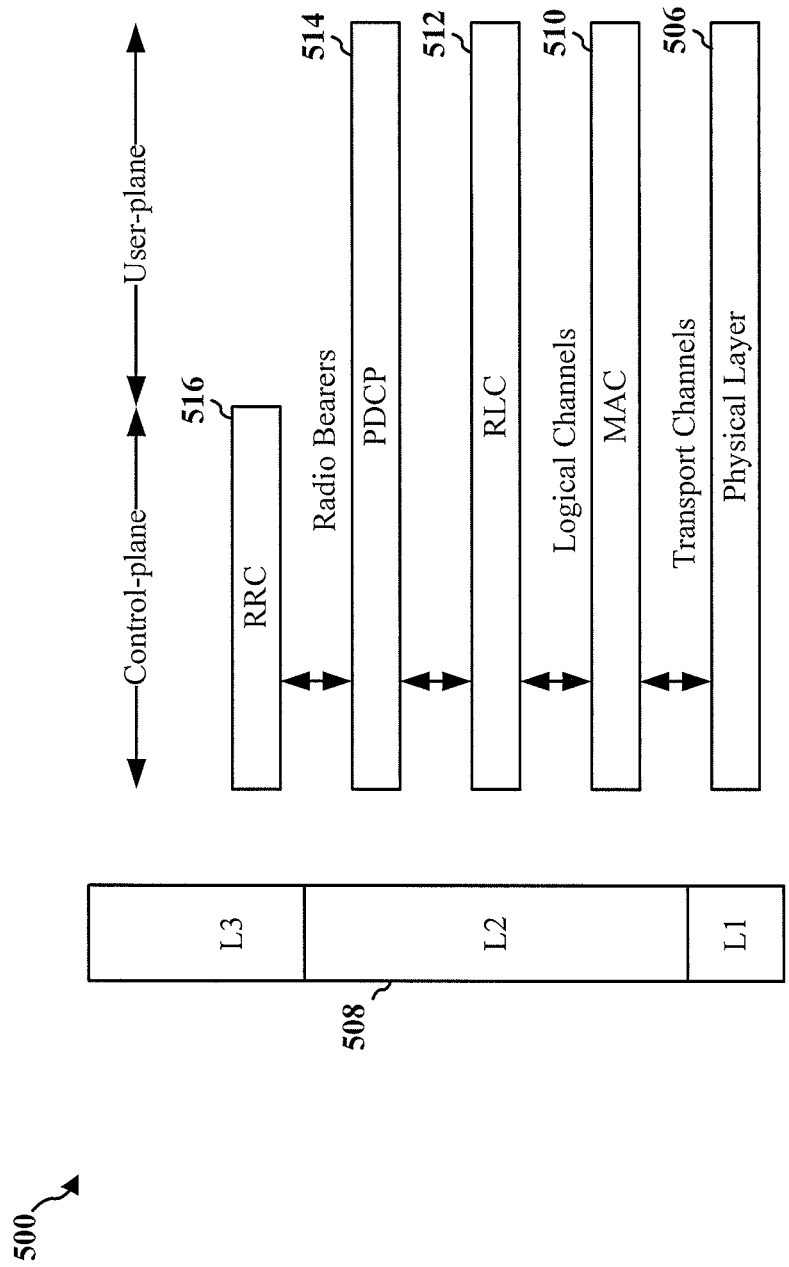
FIG. 5 is a diagram illustrating an example of a radio protocol architecture for the user and control planes.

FIG. 5 is a diagram 500 illustrating an example of a radio protocol architecture for the user and control planes in LTE. The radio protocol architecture for the UE and the eNB is shown with three layers: Layer 1, Layer 2, and Layer 3. Layer 1 (L1 layer) is the lowest layer and implements various physical layer signal processing functions. The L1 layer will be referred to herein as the physical layer 506. Layer 2 (L2 layer) 508 is above the physical layer 506 and is responsible for the link between the UE and eNB over the physical layer 506.

In the user plane, the L2 layer 508 includes a media access control (MAC) sublayer 510, a radio link control (RLC) sublayer 512, and a packet data convergence protocol (PDCP) 514 sublayer, which are terminated at the eNB on the network side. Although not shown, the UE may have several upper layers above the L2 layer 508 including a network layer (e.g., IP layer) that is terminated at the PDN gateway 118 on the network side, and an application layer that is terminated at the other end of the connection (e.g., far end UE, server, etc.).

The PDCP sublayer 514 provides multiplexing between different radio bearers and logical channels. The PDCP sublayer 514 also provides header compression for upper layer data packets to reduce radio transmission overhead, security by ciphering the data packets, and handover support for UEs between eNBs. The RLC sublayer 512 provides segmentation and reassembly of upper layer data packets, retransmission of lost data packets, and reordering of data packets to compensate for out-of-order reception due to hybrid automatic repeat request (HARQ). The MAC sublayer 510 provides multiplexing between logical and transport channels. The MAC sublayer 510 is also responsible for allocating the various radio resources (e.g., resource blocks) in one cell among the UEs. The MAC sublayer 510 is also responsible for HARQ operations.

In the control plane, the radio protocol architecture for the UE and eNB is substantially the same for the physical layer 506 and the L2 layer 508 with the exception that there is no header compression function for the control plane. The control plane also includes a radio resource control (RRC) sublayer 516 in Layer 3 (L3 layer). The RRC sublayer 516 is responsible for obtaining radio resources (e.g., radio bearers) and for configuring the lower layers using RRC signaling between the eNB and the UE.

Figure 6:
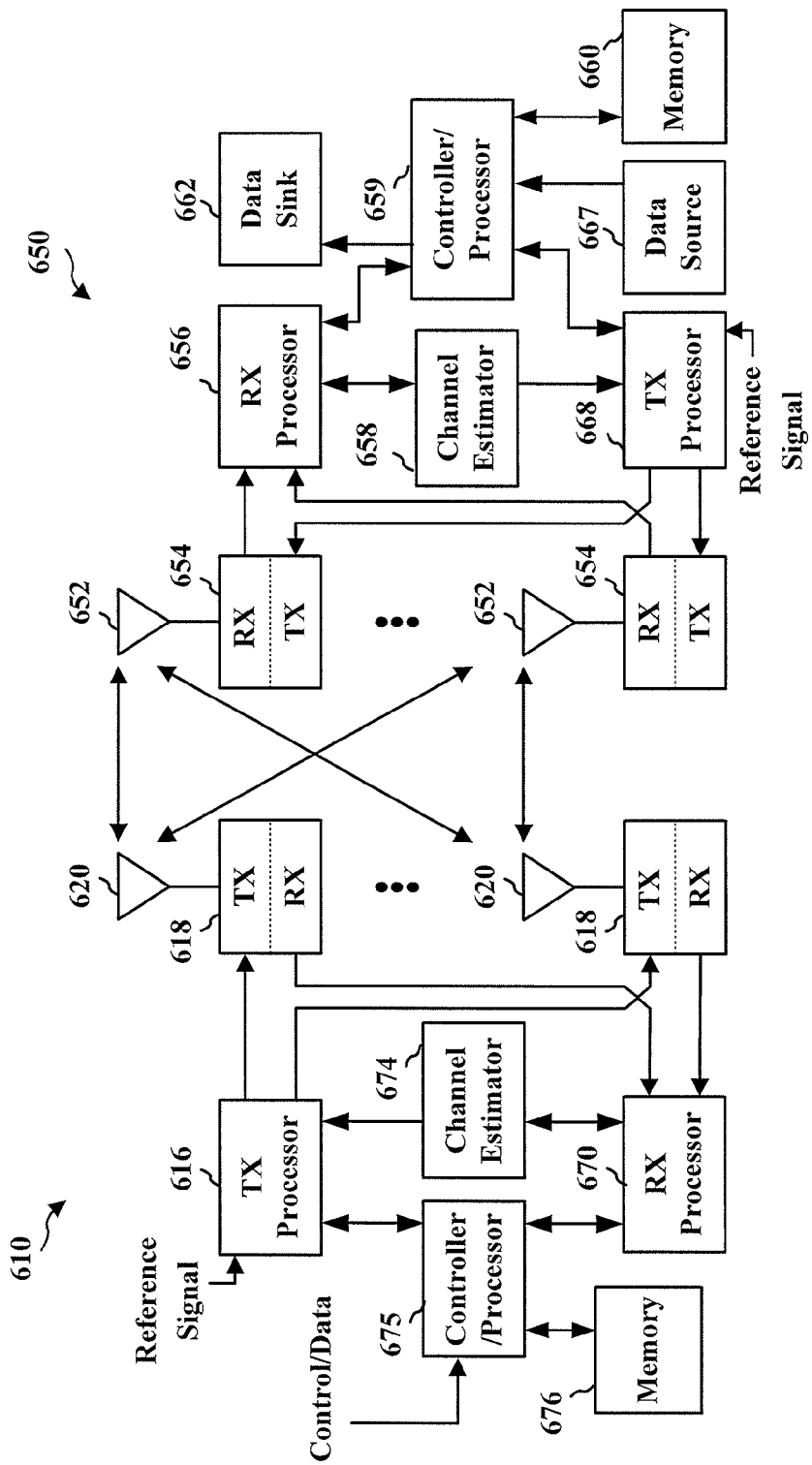
FIG. 6 is a diagram illustrating an example of an evolved Node B and user equipment in an access network.

FIG. 6 is a block diagram of an eNB 610 in communication with a UE 650 in an access network. In the DL, upper layer packets from the core network are provided to a controller/processor 675. The controller/processor 675 implements the functionality of the L2 layer. In the DL, the controller/processor 675 provides header compression, ciphering, packet segmentation and reordering, multiplexing between logical and transport channels, and radio resource allocations to the UE 650 based on various priority metrics. The controller/processor 675 is also responsible for HARQ operations, retransmission of lost packets, and signaling to the UE 650.

The transmit (TX) processor 616 implements various signal processing functions for the L1 layer (i.e., physical layer). The signal processing functions include coding and interleaving to facilitate forward error correction (FEC) at the UE 650 and mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols are then split into parallel streams. Each stream is then mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 674 may be used to determine the coding and modulation scheme, as well as for spatial processing. The channel estimate may be derived from a reference signal and/or channel condition feedback transmitted by the UE 650. Each spatial stream may then be provided to a different antenna 620 via a separate transmitter 618TX. Each transmitter 618TX may modulate an RF carrier with a respective spatial stream for transmission.

At the UE 650, each receiver 654RX receives a signal through its respective antenna 652. Each receiver 654RX recovers information modulated onto an RF carrier and provides the information to the receive (RX) processor 656. The RX processor 656 implements various signal processing functions of the L1 layer. The RX processor 656 may perform spatial processing on the information to recover any spatial streams destined for the UE 650. If multiple spatial streams are destined for the UE 650, they may be combined by the RX processor 656 into a single OFDM symbol stream. The RX processor 656 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the eNB 610. These soft decisions may be based on channel estimates computed by the channel estimator 658. The soft decisions are then decoded and deinterleaved to recover the data and control signals that were originally transmitted by the eNB 610 on the physical channel. The data and control signals are then provided to the controller/processor 659.

The controller/processor 659 implements the L2 layer. The controller/processor can be associated with a memory 660 that stores program codes and data. The memory 660 may be referred to as a computer-readable medium. In the UL, the controller/processor 659 provides demultiplexing between transport and logical channels, packet reassembly, deciphering, header decompression, control signal processing to recover upper layer packets from the core network. The upper layer packets are then provided to a data sink 662, which represents all the protocol layers above the L2 layer. Various control signals may also be provided to the data sink 662 for L3 processing. The controller/processor 659 is also responsible for error detection using an acknowledgement (ACK) and/or negative acknowledgement (NACK) protocol to support HARQ operations.

In the UL, a data source 667 is used to provide upper layer packets to the controller/processor 659. The data source 667 represents all protocol layers above the L2 layer. Similar to the functionality described in connection with the DL transmission by the eNB 610, the controller/processor 659 implements the L2 layer for the user plane and the control plane by providing header compression, ciphering, packet segmentation and reordering, and multiplexing between logical and transport channels based on radio resource allocations by the eNB 610. The controller/processor 659 is also responsible for HARQ operations, retransmission of lost packets, and signaling to the eNB 610.

Channel estimates derived by a channel estimator 658 from a reference signal or feedback transmitted by the eNB 610 may be used by the TX processor 668 to select the appropriate coding and modulation schemes, and to facilitate spatial processing. The spatial streams generated by the TX processor 668 may be provided to different antenna 652 via separate transmitters 654TX. Each transmitter 654TX may modulate an RF carrier with a respective spatial stream for transmission.

The UL transmission is processed at the eNB 610 in a manner similar to that described in connection with the receiver function at the UE 650. Each receiver 618RX receives a signal through its respective antenna 620. Each receiver 618RX recovers information modulated onto an RF carrier and provides the information to a RX processor 670. The RX processor 670 may implement the L1 layer.

The controller/processor 675 implements the L2 layer. The controller/processor 675 can be associated with a memory 676 that stores program codes and data. The memory 676 may be referred to as a computer-readable medium. In the UL, the controller/processor 675 provides demultiplexing between transport and logical channels, packet reassembly, deciphering, header decompression, control signal processing to recover upper layer packets from the UE 650. Upper layer packets from the controller/processor 675 may be provided to the core network. The controller/processor 675 is also responsible for error detection using an ACK and/or NACK protocol to support HARQ operations.

Figure 7:
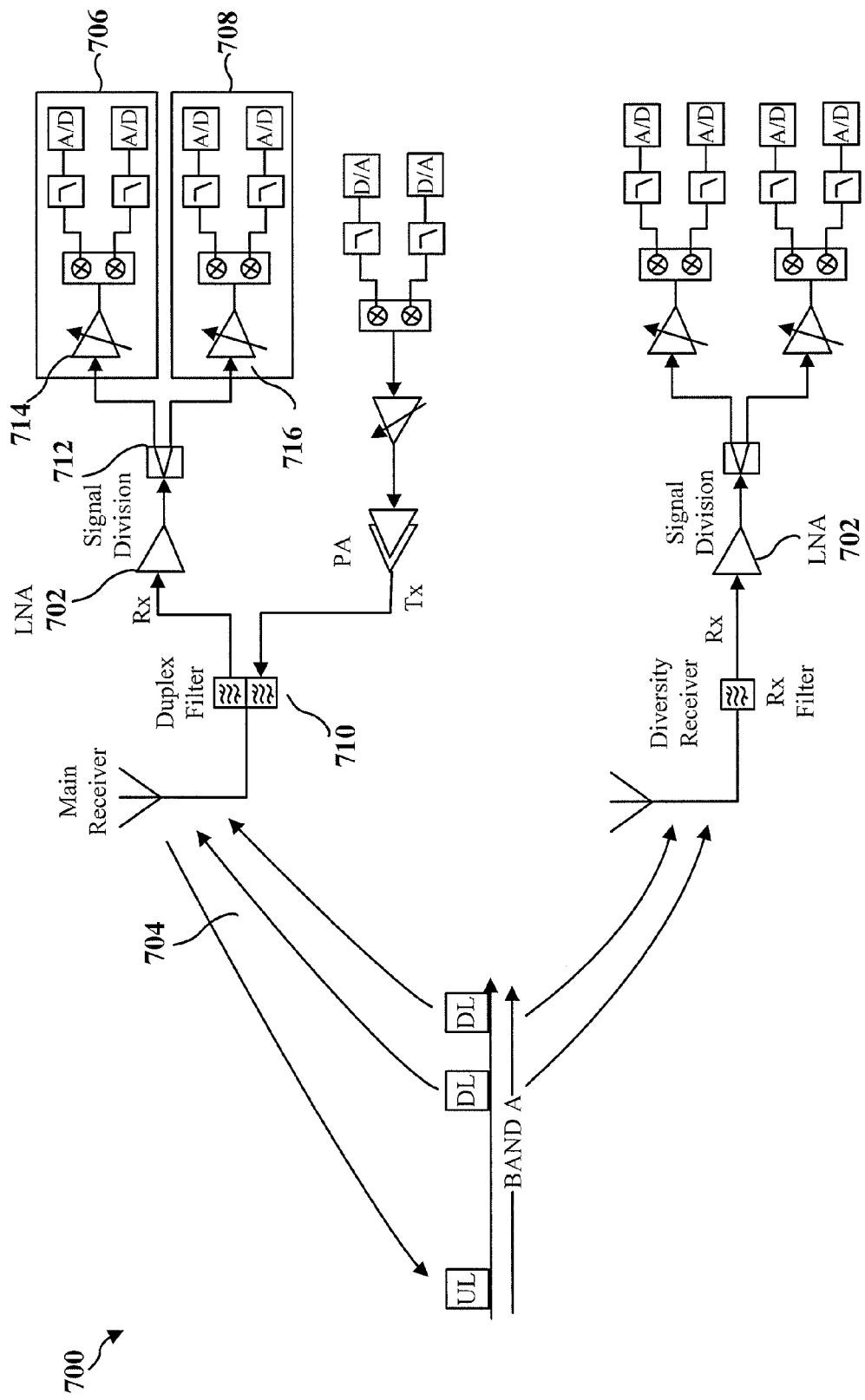
FIG. 7 is a diagram illustrating an example of a receiver system having a shared LNA and separate receive chains.

FIG. 7 is a diagram 700 illustrating an example of a receiver system having a shared LNA and separate receive chains. Carrier aggregation is an operation that combines or aggregates multiple carrier components on the physical layer to provide additional bandwidth. As an example, LTE-Advanced UEs may aggregate up to five component carriers, each of which may be up to 20 MHz in bandwidth. Thus, carrier aggregation may provide up to a total of 100 MHz (5 component carriers) for transmission in each direction. Generally, less traffic is transmitted on the uplink than the downlink, so the uplink spectrum allocation may be smaller than the downlink allocation. For example, if 20 MHz is assigned to the uplink, the downlink may be assigned 100 MHz.

Carrier aggregation may be intra-band, which means that the aggregated carrier components are within a frequency band. If the aggregated carrier components occupy more than one frequency band, then the carrier aggregation is an inter-band aggregation. Carrier aggregation may further be contiguous or non-contiguous. For contiguous carrier aggregation, the carrier components may be adjacent. For non-contiguous carrier aggregation, there may be a gap between the carrier components.

Carrier aggregation may be non-collocated carrier aggregation, which refers to a case where the PCC and SCC eNBs reside on geographically separated cell sites. With non-collocated carrier aggregation deployment, a UE may observe large timing offsets (e.g., up to 30 μs) and power offsets between the carrier components.

Non-collocated carrier aggregation may be deployed for inter-band carrier aggregation and may utilize a receiver architecture having separate receive chains and separate LNAs for each carrier. For intra-band non-contiguous carrier aggregation, a reference receiver architecture provides a receiver system having a shared LNA with separate receive chains. The separate receive chains allow for effective handling of jammers that falls between component carriers. The shared LNA may simplify the RF front-end design and may reduce insertion loss as compared to a receiver system with separate LNAs for each component carrier. However, with a shared LNA, there may be performance degradation issues due to the large timing offsets that can occur when carrier aggregation is deployed on non-collocated cell sites. There are other sources of timing offsets between the PCC and SCC. For example, one of the component carriers may be transmitted through a different base station such as a repeater. In this case, even if the UE, eNB, and the repeater are all within the same cell site, the UE may still observe a large timing offset between the PCC and the SCC. In one aspect, the examples provided in the disclosure mitigate such performance degradation issues.

As shown in FIG. 7, a single (or shared) LNA 702 may amplify the received input signal 704, after the input signal has been filtered by a duplex filter 710. After LNA 702, the amplified signal is split by a signal splitter 712 and sent to each of the two receive chains 706 and 708. In one example, the receive chain 706 is used for the PCC, and the receive chain 708 is used for the SCC. While two receive chains have been shown, more than two receive chains may be used, depending on the number of component carriers. A variable gain (e.g., through variable gain amplifiers 714, 716) may be applied after the LNA 702 at an appropriate time for each of the component carriers, respectively. Thus, the variable gain switching in receive chain 706 may be tailored for the PCC and does not affect the receive chain 708 for the SCC, and vice versa.

A variable gain switching of the LNA 702, however, may affect both the PCC and SCC. The LNA 702 may operate with a plurality of gain states. In a case that the received signal is comparatively lower in power, the LNA 702 may switch to a higher gain state to amplify the signal to improve the signal to noise ratio. In the case that the received signal is comparatively higher in power, the LNA 702 may operate at a lower gain state so as not to saturate the LNA (e.g., causing signal clipping).

In one aspect, the LNA 702 may switch a gain state based on the received signal strength or power of the input signal. In another aspect, in terms of timing, the LNA 702 may switch between gain states at a boundary of a subframe of the PCC. As discussed above, the LNA 702 switching gain states at the boundary of PCC subframes may impact the SCC. For example, a case may have the UE observing a big timing offset between the PCC and SCC and the LNA switching gain states during the data portion (e.g., portion that is not a cyclic prefix or CP) of the SCC OFDM symbol. Moreover, the UE may observe power offsets between the PCC and SCC due to, e.g., non-collocated carrier aggregation deployment. In this case, a gain state applied to PCC may not be suitable for the SCC due to the power offset, and certain performance degradation (e.g., degradation in demodulation or decoding of the SCC data) may occur. For example, the PDSCH decoding performance may be degraded for a PDSCH with a low modulation and coding scheme (MCS). For a PDSCH with a high MCS, up to a 100% PDSCH block error rate may result. Moreover, the severity of the performance degradation may correspond to the frequency of the LNA gain switching during the data portion of the SCC OFDM symbol. In an example, less PCC gain state switching may lead to a fewer number of the SCC OFDM symbols being impacted. Although the above example is based on the LNA switching gain states at a boundary of the PCC subframe, similar issues may take place in a case that the LNA switches gain states at a boundary of the SCC subframe. In that case, the decoding or demodulation performance of the PCC subframe may likewise be impacted as explained above.

Figure 8:
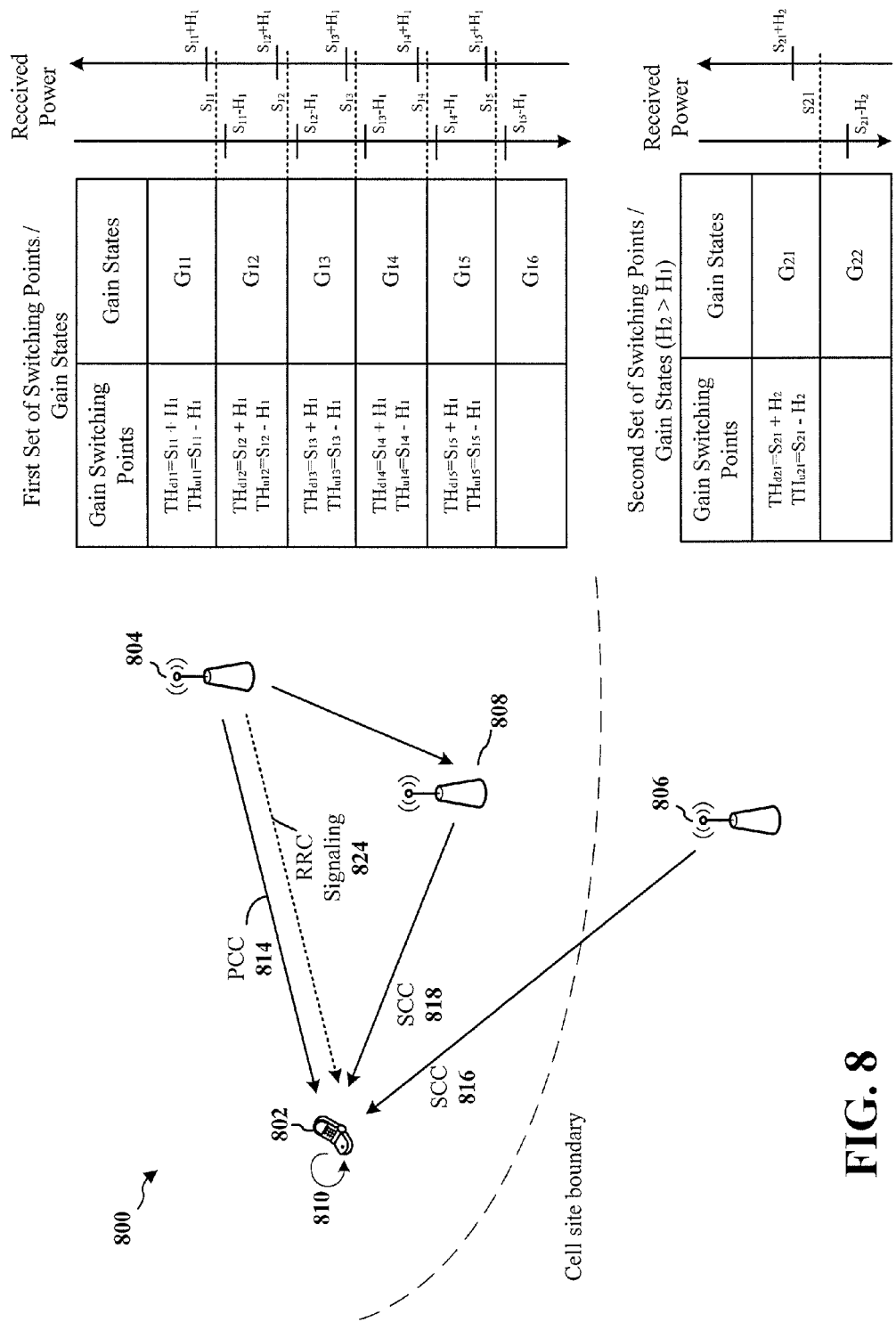
FIG. 8 is a diagram illustrating exemplary methods of amplifier gain switching.

FIG. 8 is a diagram 800 illustrating exemplary methods of amplifier gain switching. The communication system includes a UE 802 in communication with an eNB 804 and eNB 806 and may utilize carrier aggregation to increase transmission bandwidth. As shown in FIG. 8, in one case, the communication between the UE 802 and the eNB 804 is through a PCC 814, and the communication between the UE 802 and the eNB 806 is through a SCC 816. The eNB 804 and the eNB 806 may be at different cell sites. The PCC 814 and SCC 816 may be combined for reception/transmission. In another case, the UE 802 receives the SCC 818 through another base station 808. In one aspect, the base station 808 is a wireless communication node such as a repeater. A repeater may be used in wireless communication to receive and retransmit a communication link. In a case, the repeater performs the function of a relay. The eNB 804 and the base station 808 may be at a same cell site. In this case, the PCC 814 and the SCC 818 may be combined for reception/transmission. FIG. 8 further illustrates that the UE 802 may receive RRC signaling from, e.g., the eNB 804. In LTE, for example, the RRC signaling may be used for broadcast of system information related to the non-access stratum (NAS), UE measurement reporting, and quality of service (QoS) management functions.

In one aspect, the UE 802 determines 810 whether a timing offset between the PCC 814 and the SCC 816 could possibly exceed a threshold. A threshold (e.g., a threshold time period) may be a CP length of an OFDM symbol. See additional discussion on the threshold below. In one aspect, such determination may include the UE (e.g., UE 802) measuring or obtaining a timing offset between the PCC 814 and SCC 816 using a time tracking loop (TTL). In one aspect, the UE may use a TTL to track signal timing of signals received from an eNB. There are other known methods to track signal timing and determine a timing offset of received signals. In one aspect, the UE 802 switches an amplifier gain of an amplifier (e.g., the LNA 702) utilizing one of a first set of gain states or a second set of gain states based on the determination that the timing offset possibly exceeds the threshold. The first set of gain states includes a first number of gain states and the second set of gain states includes a second number of gain states less than the first number of gain states. The sets of gain states are discussed further below.

In one aspect, the UE 802 further determines whether the timing offset exceeds a threshold and configures the LNA 702 for switching among a plurality of sets of gains states based on the determination.

In one case, even for non-collocated carrier aggregation deployment, the timing offset between the PCC 814 and SCC 816 may vary depending on UE location. In another case, a LNA continuously switching between the sets of gain states (e.g., one set with two gain states and another set with multiple gain states) may not be feasible. For these cases, the UE 802 may determine 810 whether a timing offset between the PCC 814 and the SCC 816 could possibly exceed a threshold by other techniques (discussed below).

For example, in one aspect, the UE 802 determines 810 whether a timing offset between the PCC 814 and the SCC 816 could possibly exceed a threshold based on information received from the eNB 804. As discussed supra, a large timing offset may arise from non-collocated carrier aggregation or when one of the carrier components is received through a repeater (e.g., base station 808). In one example, the UE 802 determines that the timing offset between the PCC 814 and the SCC 816 could possibly exceed the threshold in a case that the UE 802 receives the RRC signaling indicating that the PCC 814 and the SCC 816 are transmitted through different base stations (e.g., eNB 804 and eNB 806). In one case, the UE 802 receives RRC signaling indicating that the PCC 814 and the SCC 816 are transmitted through different base stations of different cell sites. In another case, the UE 802 receives the RRC signaling indicating that one of the component carriers may be transmitted through the base station or repeater 808 (e.g., a base station different from the eNB 804). In this case, even if the UE 802, eNB 804, and the repeater 808 are all within the same cell site, the UE 802 may still observe a large timing offset between the PCC 814 and the SCC 818. It is understood that in such configurations, the UE may receive the PCC 814 and the SCC 816 or 818 with a large timing offset between them, and therefore, the timing offset may possibly exceed the threshold. Thus, upon receiving the configuration information from the eNB 804, the UE 802 may configure the LNA 702 for switching among a plurality of sets of gains states (which are discussed in detail below) based on the received information. In another aspect, upon receiving the non-collocated carrier aggregation information from the eNB 804, the UE 802 may further determine the timing offset (e.g., using a TTL as discussed above) between the PCC 814 and the SCC 816, and switch the LNA 702 among a plurality of sets of gains states (which are discussed in details below) based on whether the determined timing offset exceeds a threshold.

As discussed above, the LNA 702 may switch among a plurality of sets of gain states. In one aspect, the LNA 702 operates with two sets of gain states. The first set of gain states may include three or more gain states. For example, the first set of gain states may include six gain states ($G_{11}$, $G_{12}$, $G_{13}$, $G_{14}$, $G_{15}$, and $G_{16}$). In this example, the gain state $G_{11}$ is the lowest gain state (for highest input power signals). That is, gain state $G_{16} > G_{15} > G_{14} > G_{13} > G_{12} > G_{11}$. The second set of gain states may include two gain states or less. For example, the second set of gain states may include two gain states ($G_{21}$ and $G_{22}$). In this example, $G_{21}$ is the lowest gain state (for highest input power signals). That is, gain state $G_{22} > G_{21}$. Alternatively, $G_{11}$ and $G_{21}$ may be the highest gain states, and $G_{16}$ and $G_{22}$ may be the lowest gain states.

In one aspect, the LNA 702 may switch between the two sets of gain states based on certain criteria (e.g., based on a timing offset between the PCC and SCC). In another aspect, the LNA 702 switches gain states within each set of gain states based on gain switching points which are compared to, e.g., a power level of the input signal. To avoid repetitive and unnecessary switching, e.g., ping-ponging between two switching points, the gain switching points may include hysteresis steps.

In one example, the first set of gain states switch on hysteresis step $H_1$. In this example, the hysteresis step $H_1$ is applied for switching of all gain states, but this need not be the case for all embodiments. In a case that the LNA 702 is in the gain state $G_{11}$, and a power of the input signal drops to below an upward threshold $TH_{u11}$ (which is a nominal value $S_{11}$ minus the hysteresis step $H_1$), then the LNA 702 switches to a higher gain state $G_{12}$. In a case that the LNA 702 is in the gain state $G_{12}$, and a power of the input signal increases above a downward threshold $TH_{d11}$ (which is a nominal value $S_{11}$ plus the hysteresis step $H_1$), then the LNA 702 switches to a lower gain state $G_{11}$. The LNA 702 thus enters the gain state $G_{11}$ at switch point $TH_{d11}$, and exits the gain $G_{11}$ at switch point $TH_{u11}$. Switching between the gain states $G_{11}$, $G_{12}$, $G_{13}$, $G_{14}$, $G_{15}$, and $G_{16}$ operates in similar fashion.

The second set of gain states switching operates on hysteresis step $H_2$ in a similar fashion as described above. In a case that the LNA 702 is in the gain state $G_{21}$, and a power of the input signal drops to below an upward threshold $TH_{u21}$ (which is a nominal value $S_{21}$ minus the hysteresis step $H_2$), then the LNA 702 switches to a higher gain state $G_{22}$. In a case that the LNA 702 is in the gain state $G_{22}$, and a power of the input signal increases above a downward threshold $TH_{d21}$ (which is a nominal value $S_{21}$ plus the hysteresis step $H_2$), then the LNA 702 switches to a lower gain state $G_{21}$. The LNA 702 thus enters the gain state $G_{21}$ at switch point $TH_{d21}$, and exits the gain $G_{21}$ at switch point $TH_{u21}$.

In one aspect, $H_2$ is greater than $H_1$. In another aspect, an average of hysteresis steps of the second set of gain states (having fewer gain states) is greater than an average of hysteresis steps of the first set of gain states. In yet another aspect, $H_2$ and $H_1$ may be the same.

As demonstrated above, for an LNA operation with only two gain states (e.g., the second set of gain states), LNA gain switching happens only for input power level around a single LNA gain switching point ($TH_{u21}$ and $TH_{d21}$). For LNA operation with multiple LNA gain states (e.g., the first set of gain states), LNA gain switching may occur more often due to multiple LNA gain switching points (e.g., $TH_{u11}$ and $TH_{d11}$-$TH_{u15}$ and $TH_{d15}$). In one aspect, the multiple LNA gain states (e.g., the first set of gain states) having more gain states may be desirable for better optimization of power consumption, blocker (of undesired frequency bands) suppression, and receiver noise figure.

Figure 9:
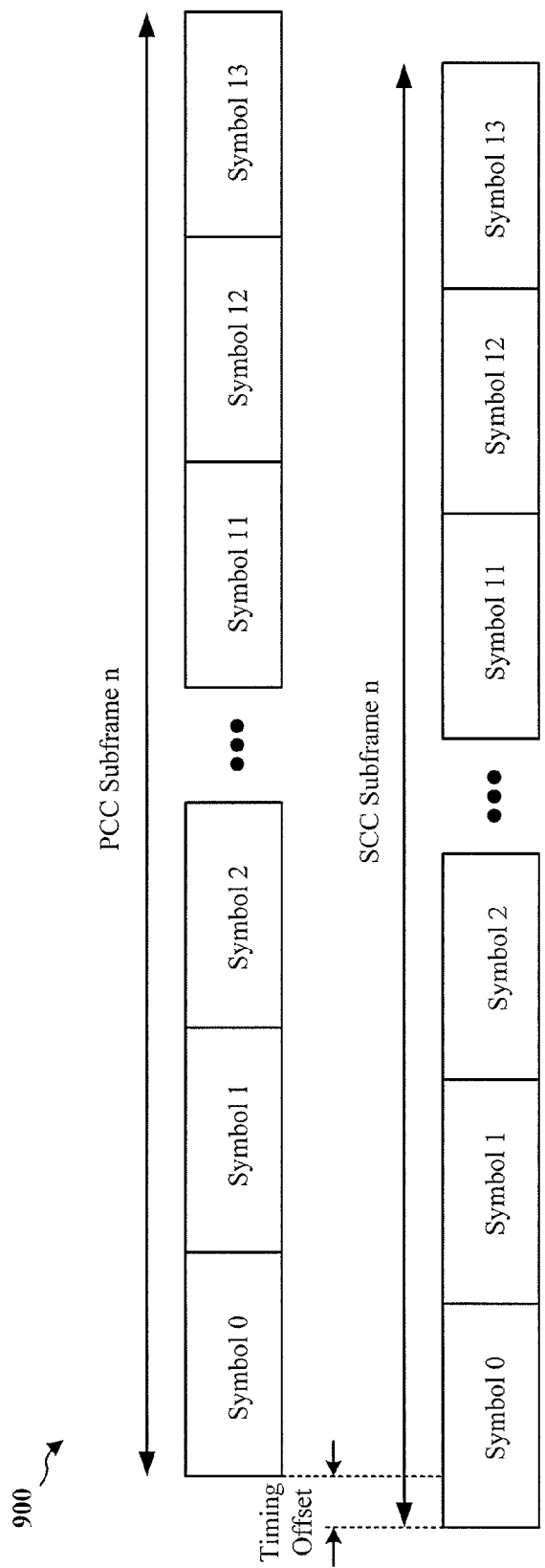
FIG. 9 is a diagram illustrating an example of a PCC and SCC timing offset.

FIG. 9 is a diagram 900 illustrating an example of a PCC and SCC timing offset. In the diagram 900, the PCC and SCC subframes may be downlink subframes. In one aspect, the subframe of the SCC is ahead in time of a subframe of the PCC. In other words, the boundaries of the PCC subframe and SCC subframe are not aligned. As illustrated, a PCC subframe may include OFDM symbols 0-13, and an SCC subframe may likewise include OFDM symbols 0-13. The symbol 0 of the SCC subframe is ahead of the symbol 0 of the PCC by a timing offset. When the timing offset is larger than the CP of the OFDM symbols, the LNA may switch the gain states at a time aligned with the subframe boundary of one component carrier but in a data portion of an OFDM symbol of the other component carrier. The affected OFDM symbol of the other component carrier could be the first OFDM symbol in the same subframe or could be the last OFDM symbol in the previous subframe depending on the direction of the timing offset. When LNA gain switching occurs in the middle of an OFDM symbol, PDSCH decoding performance can be degraded for a low MCS on the corresponding PDSCH and up to 100% PDSCH BLER can occur for a high MCS on the corresponding PDSCH.

Figure 10:
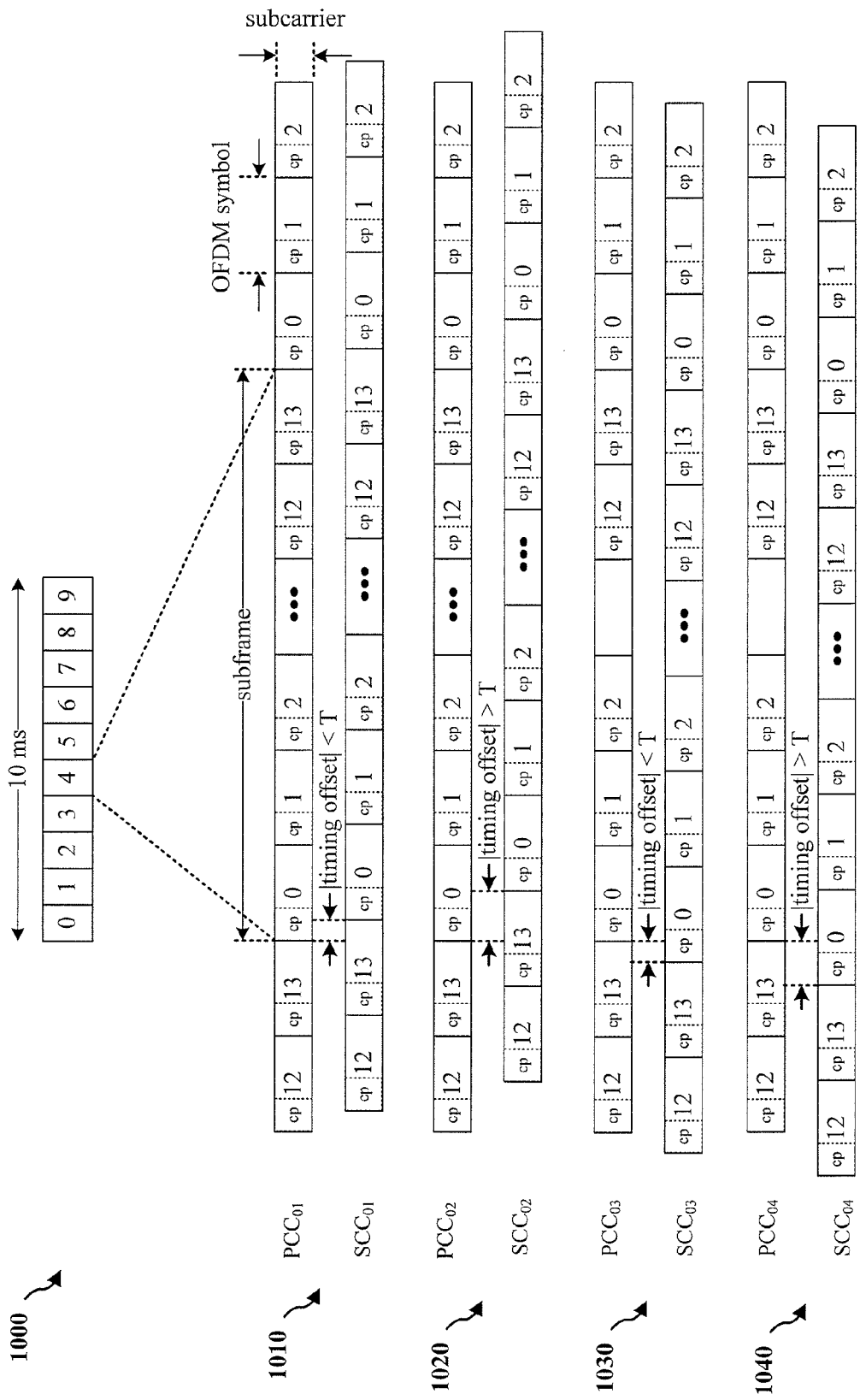
FIG. 10 is a diagram illustrating additional examples of PCC and SCC timing offsets.

FIG. 10 is a diagram 1000 illustrating additional examples of PCC and SCC timing offsets. An LTE frame is 10 ms and may include 10 subframes (see, FIG. 3). A subframe may include 14 OFDM symbols (0-13), and each OFDM symbol includes a CP. The CP serves as, inter alia, a guard band for the OFDM symbol. In LTE, for example, the length of a CP may be approximately 5.2 μs or 4.7 μs. In comparison, an OFDM symbol may be approximately 71.4 μs.

As discussed supra, a UE may determine whether a timing offset between a PCC and an SCC possibly exceeds a threshold T. The UE switches an amplifier gain utilizing one of a first set of gain states or a second set of gain states based on the determination that the timing offset possibly exceeds the threshold T. The threshold T may be a length of the CP (e.g., 5.2 μs) within an OFDM symbol. When a large timing offset (e.g., up to 30 μs discussed above) is observed between the PCC and the SCC, a boundary of a PCC subframe may line up with the data portion of an SCC subframe. Thus, when the LNA switches the gain state at the boundary of the PCC subframe, the decoding performance for the SCC subframe may degrade. When the timing offset is less than the threshold T (e.g., 5.2 μs), the boundary of the PCC subframe may line up within the CP portion of the SCC subframe. In this case, the decoding performance for the SCC subframe may not degrade. Such examples are discussed in more detail below.

In FIG. 10, the diagram 1010 illustrates the timing offset between the $PCC_{O1}$ and the $SCC_{O1}$. In this example, the $SCC_{O1}$ trails the $PCC_{O1}$ in time, and the timing offset is less than the threshold T (e.g., a CP length or 5.2 μs). The diagram 1020 illustrates the timing offset between the $PCC_{O2}$ and the $SCC_{O2}$. In this example, the $SCC_{O2}$ trails the $PCC_{O2}$ in time, and the timing offset is greater than the threshold T. The diagram 1030 illustrates the timing offset between the $PCC_{O3}$ and the $SCC_{O3}$. In this example, the $SCC_{O3}$ leads the $PCC_{O3}$ in time, and the timing offset is less than the threshold T. The diagram 1040 illustrates the timing offset between the $PCC_{o4}$ and the $SCC_{O4}$. In this example, the $SCC_{O4}$ leads $PCC_{O4}$ in time, and the timing offset is greater than the threshold T.

The diagrams 1010 and 1030 illustrate timing offsets that are less than (and therefore, do not exceed) the threshold T or a length of a CP. The diagrams 1020 and 1040 illustrate timing offsets that exceed the threshold T or a length of a CP. When the timing offset exceeds the CP length of an OFDM symbol or the threshold T and LNA switching is aligned with a subframe boundary of one component carrier (e.g., PCC), a gain switch at the LNA may impact decoding of an OFDM symbol of the other component carrier (e.g., SCC). The impacted OFDM symbol could be the first OFDM symbol in the same subframe or the last OFDM symbol in previous subframe depending on the direction of the timing offset. In the diagram 1020, the $SCC_{O2}$ trails the $PCC_{O2}$ in time. In a case that the LNA 702 switches the gain state at the beginning of the PCC subframe 4, the SCC OFDM symbol 13 of the previous subframe may be impacted. In the diagram 1040, the $SCC_{O4}$ leads the $PCC_{O4}$ in time. In a case that the LNA 702 switches the gain state at the beginning of the PCC subframe 4, the SCC OFDM symbol 0 of the same subframe may be impacted.

In a case that the LNA gain switching takes place in the middle of an OFDM symbol as discussed above, certain performance degradation may occur. For example, the PDSCH decoding performance may be degraded for a PDSCH with a low MCS. For a PDSCH with a high MCS, up to 100% PDSCH block error rate (BLER) may result. Moreover, the severity of the performance degradation may correspond to the frequency of the LNA gain switching during the data portion of the SCC OFDM symbol. For example, less gain state switching may impact fewer OFDM symbols of the other carrier. Thus, when the LNA gain switching takes place in the middle of an OFDM symbol of the SCC, one aspect of the disclosed examples reduces the number of gain state switching by switching to a set of gain states with fewer gain states (e.g., the second set of gain states with two gain states).

In one aspect, the LNA 702 switches the sets of gain states based on the timing offsets between the component carriers (e.g., PCC and SCC) in an aggregated carrier configuration. When a timing offset between the PCC and the SCC is less than a CP length or the threshold T, more gain states (e.g., the first set of gain states) may be utilized by the LNA. The LNA 702 may accordingly switch to the first set of gain states. When a timing offset between the PCC and the SCC is greater than a CP length or the threshold T, fewer gain states (e.g., the second set of gain states) may be utilized by the LNA. The LNA 702 may accordingly switch to the second set of gain states. Using the set of gain states with less gain states reduces the frequency of gain state switching. Moreover, the hysteresis step for LNA gain switching may be differently optimized for the small and large timing offset cases. For example, the hysteresis step $H_2$ for the second set of gain states may be greater than the hysteresis step $H_1$ for the first set of gain states so that a frequency of the gain switching may be further reduced when the LNA 702 operates using the second set of gain states.

In another aspect, the UE may determine whether a timing offset between the PCC and the SCC could possibly exceed the threshold T by determining the timing offset between the PCC and the SCC. The threshold T may be, for example, a CP length of an OFDM symbol. In one aspect, the UE (e.g., UE 802) measures or obtains the timing offset between the PCC and the SCC using a TTL. In one aspect, the UE may use a TTL to track signal timing of signals received from an eNB. There are other known methods to track signal timing and determine a timing offset of received signals. The UE 802 then determines whether the timing offset exceeds the threshold T by comparing the timing offset to the threshold T. The LNA 702 may switch between the first set of gain states and the second set of gain states based on the determined timing offset and the comparison with the threshold T.

In another aspect (referring to FIG. 8), the UE 802 determines whether a timing offset between the PCC and the SCC could possibly exceed the threshold T based on information received from eNB 804. As discussed supra, a large timing offset may arise from non-collocated carrier aggregation or when one of the carrier components is received through a repeater (e.g., base station 808). In one example, the UE 802 determines that the timing offset between the PCC 814 and the SCC 816 could possibly exceed the threshold when the UE 802 receives the RRC signaling indicating that the PCC 814 and the SCC 816 are transmitted through different base stations. In one aspect, the UE 802 may receive the RRC signaling indicating that the PCC 814 and the SCC 816 are transmitted through different base stations of different cell sites (e.g., eNB 804 and eNB 806). In another aspect, the UE 802 may receive the RRC signaling indicating that one of the component carriers may be transmitted through the base station or repeater 808 (e.g., a base station different from the eNB 804). In this case, even if the UE 802, eNB 804, and the repeater 808 are all within the same cell site, the UE 802 may still observe a large timing offset between the PCC 814 and the SCC 818. It is understood that in such configurations, the UE may receive the PCC 814 and the SCC 816 or 818 with a large timing offset between them, and therefore, the timing offset may possibly exceed the threshold. Thus, upon receiving the configuration information from the eNB 804, the UE 802 may configure the LNA 702 for switching to utilize the second set of gain states. In a case that the UE 802 does not receive the RRC signaling indicating that the PCC 814 and the SCC 816 are through different base stations (e.g., one of the base stations may be a repeater) and/or that the base stations are at different cell sites, the UE 802 may configure the LNA 702 for switching to utilize the first set of gain states for better performance.

In another aspect, upon receiving the information indicating non-collocated carrier aggregation, the UE 802 may further determine the timing offset between the PCC and the SCC (e.g., using the TTL) and configure the LNA 702 for switching to utilize the first set of gain states or the second set of gain states based on the determined timing offset.

In another aspect, the UE determines whether the timing offset exceeds the threshold T (e.g., a CP length of an OFDM symbol). For example, the UE utilizes a TTL to measure the timing offset between the PCC and the SCC. The UE may then compare the measured value with the threshold T via, e.g., a comparator. In a case that the determined timing offset is greater than the threshold T (e.g., the CP length), the LNA 702 utilizes (or switches to) the second set of gain states (having fewer gain states). In this manner, the number of amplifier gain switching may be reduced. In a case that the determined timing offset is less than the threshold T (e.g., a CP length), the LNA 702 utilizes (or switches to) the first set of gain states (having more gain states). In this manner, the system may be better optimized for power consumption, blocker (of undesired frequency bands) suppression, and receiver noise figure.

As a person of ordinary skill in the art recognizes, the discussion above is not limited to LNAs but may be applied to other types of amplifiers. For example, a transmitter architecture may utilize a shared power amplifier (PA) for aggregation of two uplink intra-band non-contiguous carriers. The features discussed above may be applicable to the shared PA.

Figure 11:
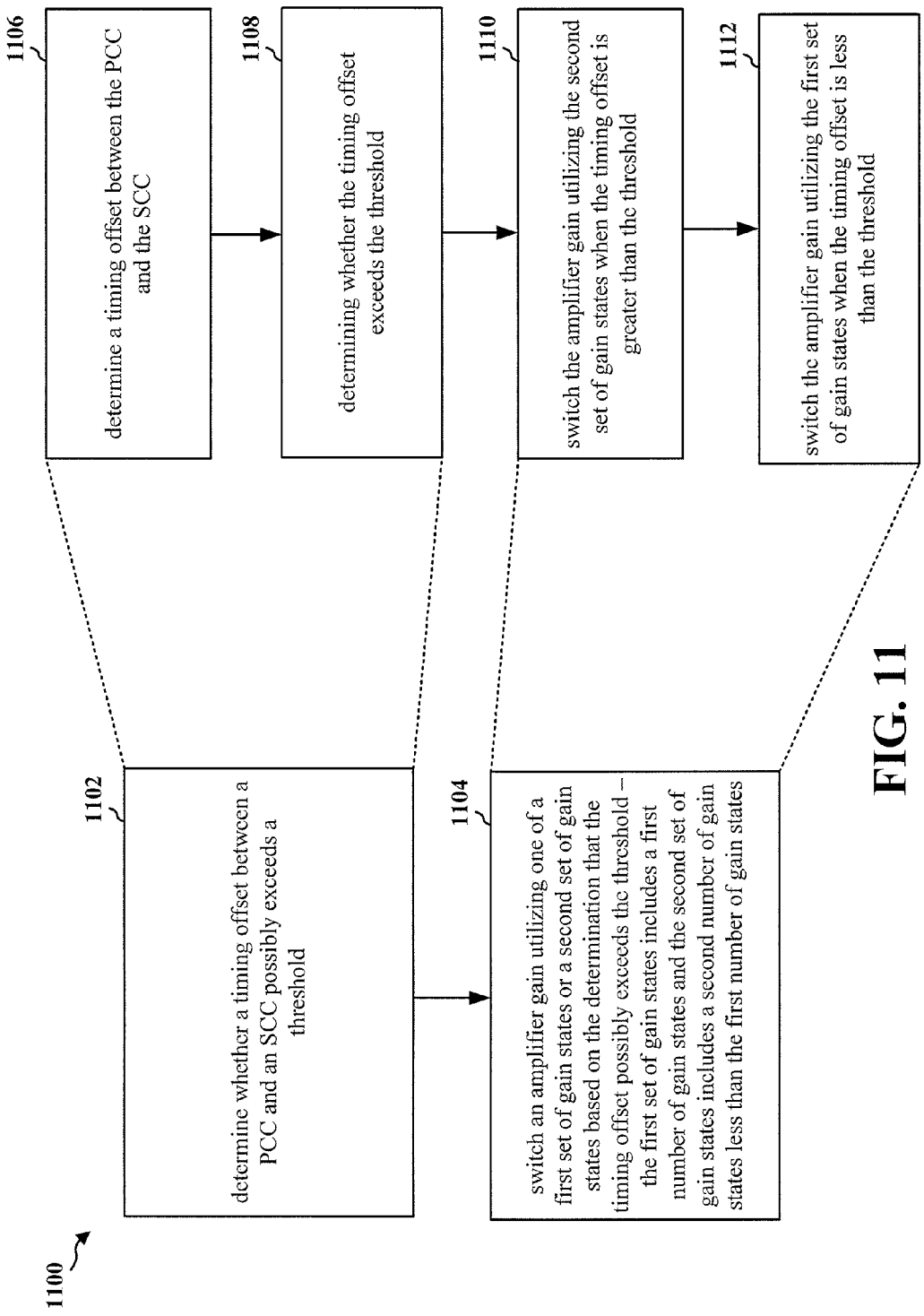
FIG. 11 is a flow chart of an exemplary method of amplifier gain switching.

FIG. 11 is a flow chart 1100 of a method of wireless communication. The method may be performed by a UE. At step 1102, the UE determines whether a timing offset between a PCC and an SCC possibly exceeds a threshold. In one aspect, the term "possibly" may refer to a probability exceeding a probability threshold, which may be zero. Examples of step 1102 may include the UE determining that a timing offset between the PCC and the SCC exceeds the threshold. In another example, the UE may determine whether the timing offset between the PCC and the SCC possibly exceeds the threshold based on a received RRC signaling indicating that the PCC and the SCC are through non-collocated base stations. In another example, the UE may determine whether the timing offset between the PCC and the SCC possibly exceeds the threshold based on a received RRC signaling indicating that the PCC and the SCC could be subject to a large timing offset (e.g., one of the base stations may be a repeater).

In one aspect, step 1102 further includes step 1106 and step 1108. At step 1106, the UE determines a timing offset between the PCC and the SCC. At step 1108, the UE determines whether the timing offset exceeds the threshold. See, e.g., FIGS. 8 and 10 and the associated discussion. In one aspect, the UE (e.g., UE 802) measures or obtains the timing offset between the PCC and the SCC using the TTL. The UE 802 then determines whether the timing offset exceeds the threshold T by comparing the timing offset to the threshold T. The LNA 702 may switch between the first set of gain states and the second set of gain states based on the determined timing offset and the comparison with the threshold T.

At step 1104, the UE switches an amplifier gain utilizing one of a first set of gain states or a second set of gain states based on the determination that the timing offset possibly exceeds the threshold. The first set of gain states includes a first number of gain states, and the second set of gain states includes a second number of gain states less than the first number of gain states. In one aspect, the step 1104 further includes the step 1110 and the step 1112. See, e.g., FIGS. 8 and 10 and the associated discussion. In a case that the determined timing offset is greater than the threshold T (e.g., the CP length), the LNA 702 utilizes (or switches to) the second set of gain states (having fewer gain states). In this manner, the frequency of amplifier gain switching may be reduced. In an example, less PCC gain state switching may lead to a smaller number of the SCC OFDM symbols being impacted, and therefore, decoding performance degradation issues of the SCC OFDM may be reduced. As discussed supra, in a case that the determined timing offset is less than the threshold T (e.g., a CP length), the LNA 702 utilizes (or switches to) the first set of gain states (have more gain states). In this manner, the system may be better optimized for power consumption, blocker (of undesired frequency bands) suppression, and receiver noise figure.

Figure 12:
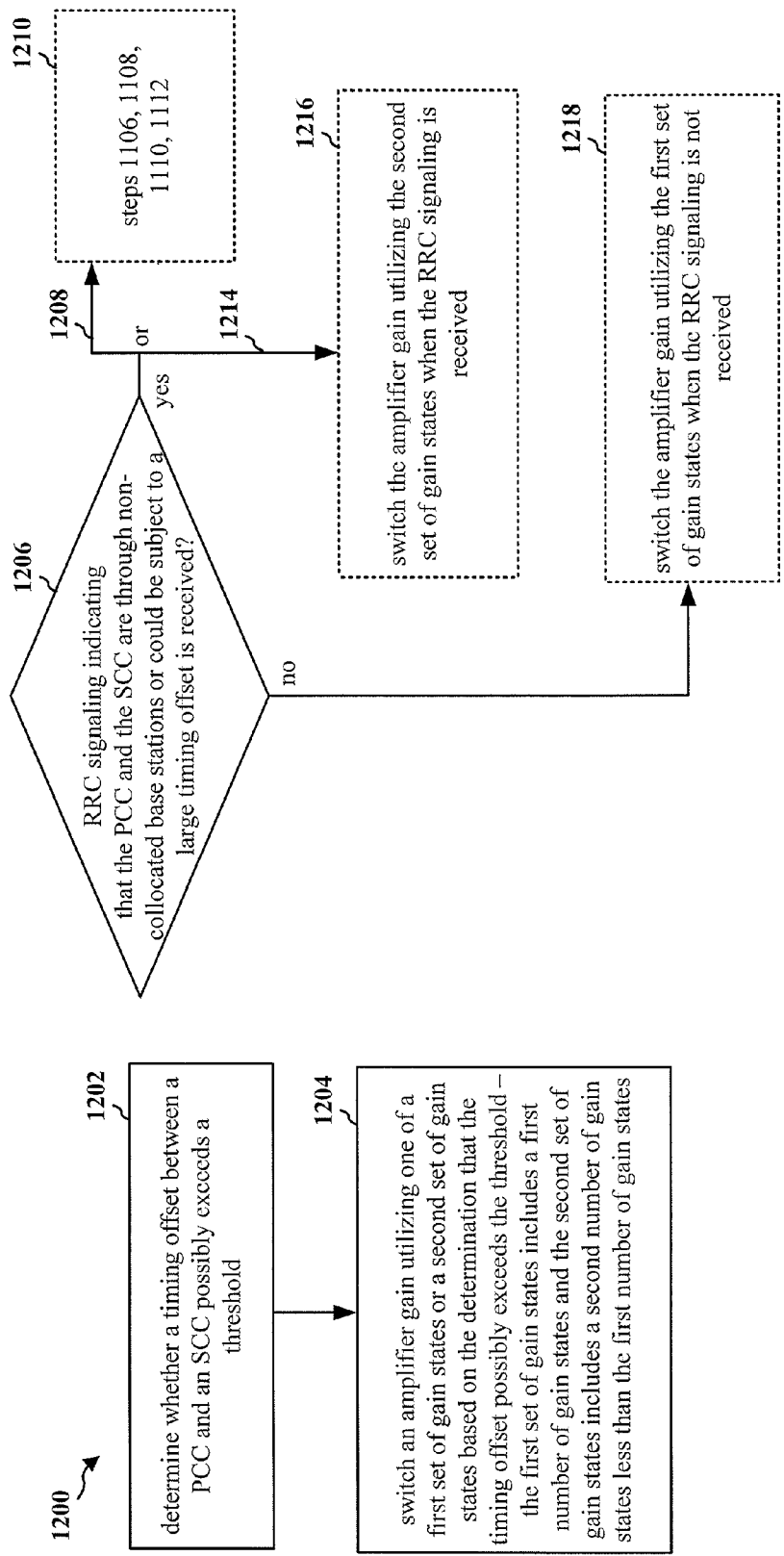
FIG. 12 is another flow chart of a method of exemplary method of amplifier gain switching.

FIG. 12 is a flow chart 1200 of a method of wireless communication. The method may be performed by a UE. At step 1202, the UE determines whether a timing offset between a PCC and an SCC possibly exceeds a threshold. In one aspect, the term "possibly" may refer to a probability exceeding a probability threshold, which may be zero. Examples of step 1202 may include the UE determining that a timing offset between the PCC and the SCC exceeds the threshold. In another example, the UE may determine whether the timing offset between the PCC and the SCC possibly exceeds the threshold based on a received RRC signaling indicating that the PCC and the SCC are through non-collocated base stations. In another example, the UE may determine whether the timing offset between the PCC and the SCC possibly exceeds the threshold based on a received RRC signaling indicating that the PCC and the SCC could be subject to a large timing offset (e.g., one of the base stations may be a repeater).

The step 1202 may include the step 1210, which includes the steps 1106, 1108, 1110, and 1112 discussed previously. Moreover, the step 1202 may include the step 1206 in which the UE determines whether an RRC signaling is received indicating that the PCC and the SCC are transmitted through non-collocated base stations or could be subject to a large timing offset (e.g., the different base stations are non-collocated or one of the base stations may be a repeater). In a case that such RRC signaling is received, the UE may operate according to the step 1210 (following path 1208), or the UE may operate according to step 1216 (following path 1214).

At step 1216, the UE switches the amplifier gain utilizing the second set of gain states when the RRC signaling is received. See, e.g., FIGS. 8 and 10 and the associated discussion. As discussed supra, a large timing offset may arise from non-collocated carrier aggregation or when one of the carrier components is received through a repeater (e.g., base station 808). In one example, the UE 802 determines that the timing offset between the PCC 814 and the SCC 816 could possibly exceed the threshold when the UE 802 receives the RRC signaling indicating that the PCC 814 and the SCC 816 are transmitted through different base stations. In one case, the UE 802 receives RRC signaling indicating that the PCC 814 and the SCC 816 are transmitted through different base stations of different cell sites (e.g., eNB 804 and eNB 806). In one case, the UE 802 receives the RRC signaling indicating that one of the component carriers may be transmitted through the base station or repeater 808 (i.e. a base station different from the eNB 804). In this case, even if the UE, eNB, and the repeater are all within the same cell site, the UE 802 may still observe a large timing offset between the PCC 814 and the SCC 818. It is understood that in such configurations, the UE may receive the PCC 814 and the SCC 816 or 818 with a large timing offset between them, and therefore, the timing offset may possibly exceed the threshold. Thus, upon receiving the configuration information from the eNB 804, the UE 802 may configure the LNA 702 for switching to utilize the second set of gain states. In a case that the UE 802 does not receive the RRC signaling indicating that the PCC 814 and the SCC 816 are through different base stations (e.g., one of the base stations is a repeater or the different base stations are non-collocated) and/or that the base stations are at different cell sites, the UE 802 may configure the LNA 702 for switching to utilize the first set of gain states.

At step 1204, the UE switches an amplifier gain utilizing one of a first set of gain states or a second set of gain states based on the determination that the timing offset possibly exceeds the threshold. The first set of gain states includes a first number of gain states and the second set of gain states includes a second number of gain states less than the first number of gain states. The step 1204 may include the step 1216 and the step 1218, which are described above. In one aspect, at step 1206, the UE determines whether RRC signaling indicating that the PCC and the SCC are transmitted through non-collocated base stations or could be subject to a large timing offset (e.g., the different base stations are non-collocated or one of the base stations is a repeater) is received. When such RRC signaling is received, the UE may follow path 1214 and switch the amplifier gain utilizing the second set of gain states (step 1216). When such RRC signaling is not received, the UE may switch the amplifier gain utilizing the first set of gain states (step 1218).

Figure 13:
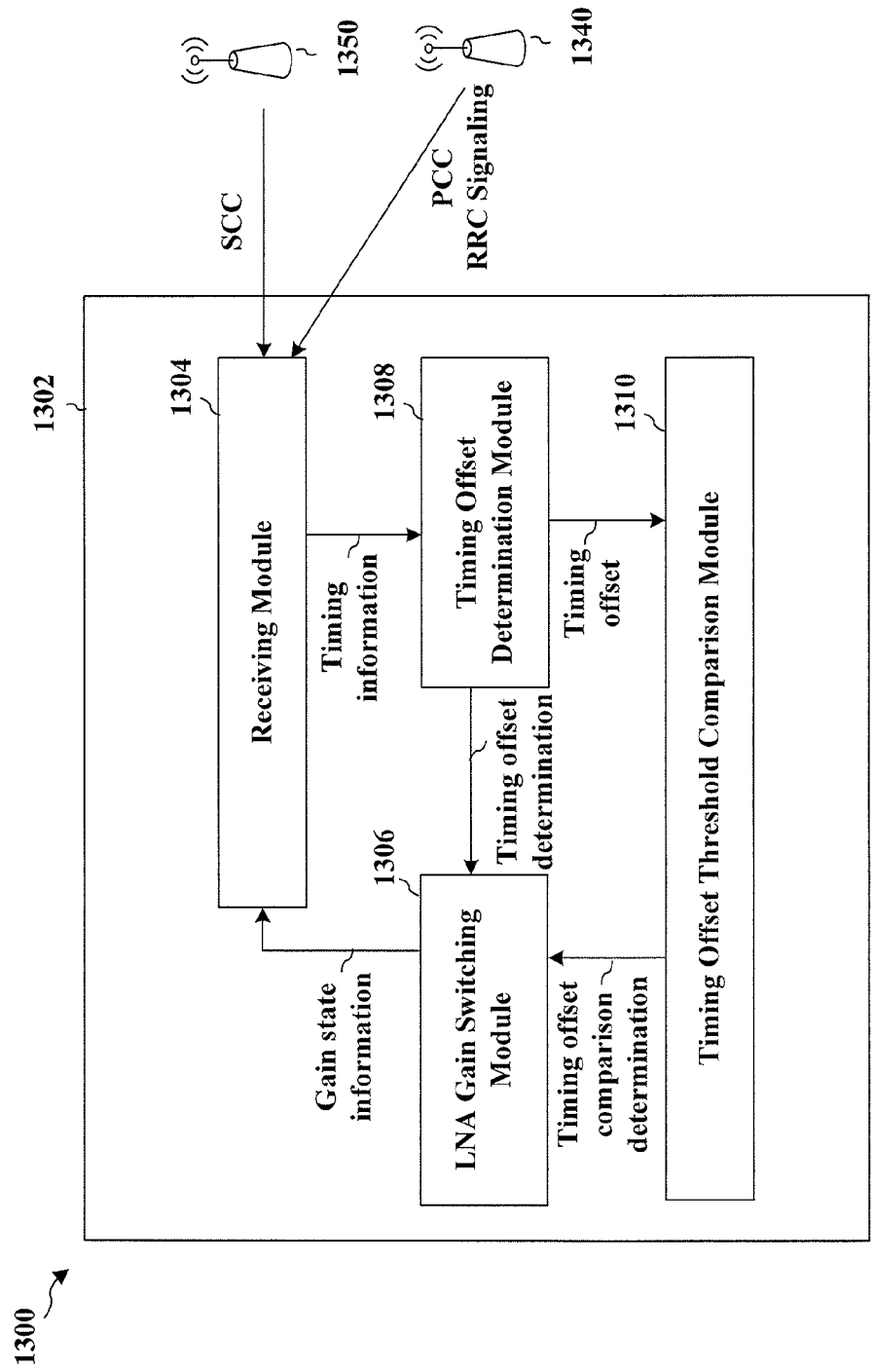
FIG. 13 is a conceptual data flow diagram illustrating the data flow between different modules/means/components in an exemplary apparatus.

FIG. 13 is a conceptual data flow diagram 1300 illustrating the data flow between different modules/means/components in an exemplary apparatus 1302. The apparatus may be a UE. The UE includes a timing offset determination module 1308 that is configured to determine whether a timing offset between a PCC from an eNB 1340 and an SCC from an eNB 1350 possibly exceeds a threshold. The timing offset determination module 1308 receives timing information relating to the PCC and the SCC timing for the determination. The timing information may include, for example, the timing of the PCC and the SCC (e.g., downlink timing). The timing offset determination module 1308 may be configured to determine the timing offset between the PCC and the SCC based on the timing information. The timing offset determination module 1308 may provide the determined timing offset (e.g., downlink timing offset) to the timing offset threshold comparison module 1310. The timing offset threshold comparison module 1310 may be configured to determine whether the timing offset exceeds the threshold and to provide the timing offset determination to the LNA gain switching module 1306. The threshold may be a length of a CP in an OFDM symbol.

In another example, the timing information may include, for example, an RRC signaling indicating that the PCC and the SCC are through non-collocated base stations or could be subject to a large timing offset. The timing offset determination module 1308 may be configured to determine that the timing offset between the PCC and the SCC possibly exceeds the threshold based at least in part on the received RRC signaling. For example, the timing offset determination module 1308 may be configured to determine that the timing offset possibly exceeds the threshold based on the RRC signaling (timing information) indicating that the PCC and the SCC are through different base stations (e.g., one of the base stations is a repeater). The timing offset comparison determination may be provided to the LNA gain switching module 1306.

The UE further includes an LNA gain switching module 1306 that is configured to switch an amplifier gain of an amplifier (e.g., LNA) utilizing one of a first set of gain states or a second set of gain states based on the determination that the timing offset possibly exceeds the threshold (e.g., the timing offset determination from the timing offset determination module 1308 or the timing offset comparison determination from the timing offset threshold comparison module 1310). The first set of gain states includes a first number of gain states and the second set of gain states includes a second number of gain states less than the first number of gain states. The LNA gain switching module 1306 may be configured to switch the amplifier gain of the amplifier (e.g. LNA) utilizing the second set of gain states when the timing offset is greater than the threshold, and utilizing the first set of gain states when the timing offset is less than the threshold. The LNA gain switching module 1306 may be configured to switch the amplifier gain at one or more subframe boundaries of the PCC in a set of frames. In one aspect, a hysteresis step for switching the amplifier gain utilizing the first set of gain states may be less than a hysteresis step for switching the amplifier gain utilizing the second set of gain states. The first set of gain states may include at least three gain states. The LNA gain switching module 1306 may provide the gain state information for the amplifier (e.g., LNA) to the receiving module 1304.

The receiving module 1304 is configured to receive an RRC signaling indicating that the PCC and the SCC are through different base stations (e.g., one of the base stations is a repeater) and the PCC and SCC signals. The receiving module 1304 may provide the timing information relating to the PCC and the SCC timing to the timing offset determination module 1308.

Moreover, the receiving module 1304 may include an amplifier for receiving the PCC and the SCC. For example, the amplifier may be the LNA. The receiving module 1304 may be configured to set or switch a gain state of the amplifier (e.g., LNA) in response to the gain state information from the LNA gain switching module.

The apparatus may include additional modules that perform each of the steps of the algorithm in the aforementioned flow charts of FIGS. 11 and 12. As such, each step in the aforementioned flow charts of FIGS. 11 and 12 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 14:
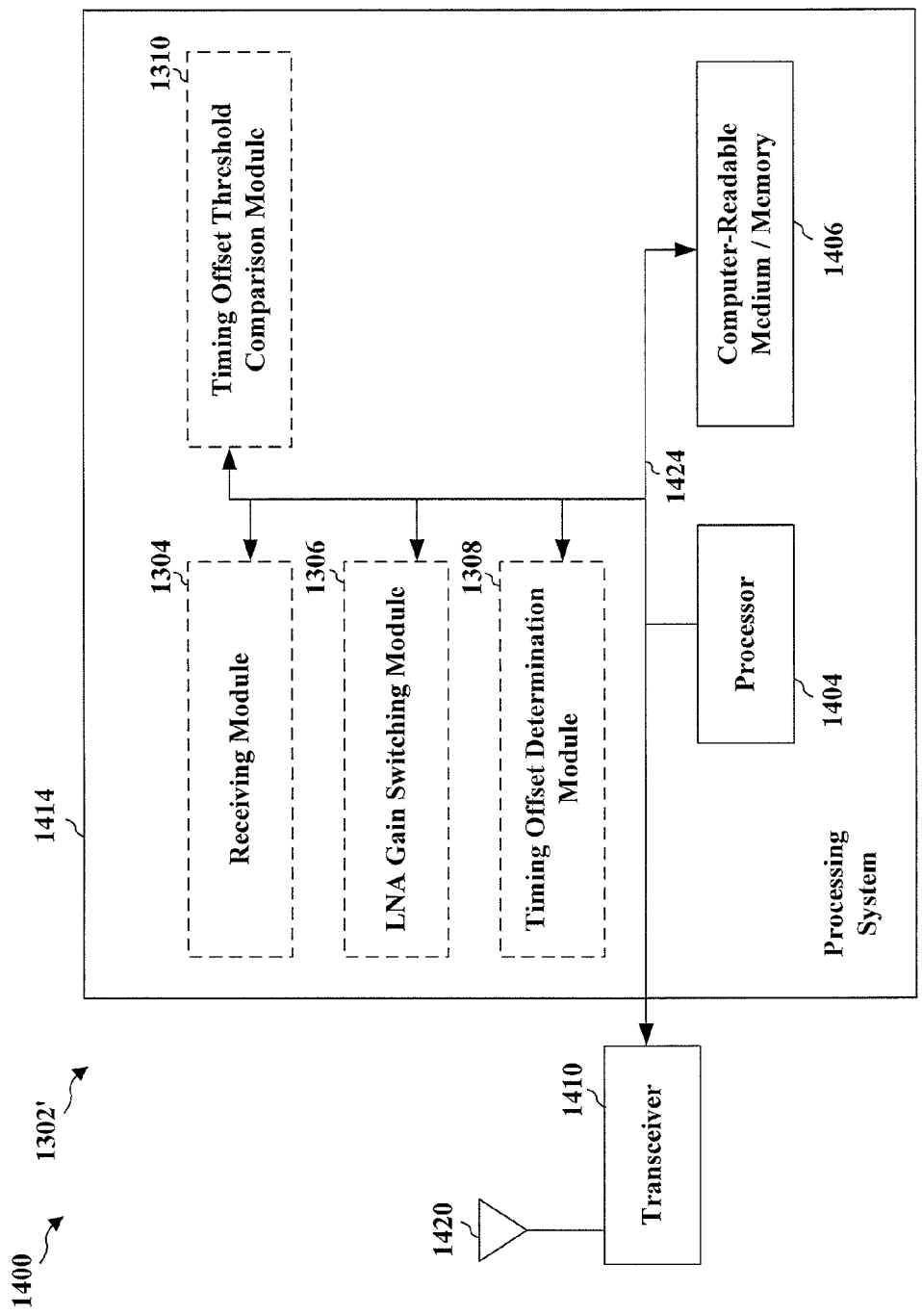
FIG. 14 is a diagram illustrating an example of a hardware implementation for an apparatus employing a processing system.

FIG. 14 is a diagram 1400 illustrating an example of a hardware implementation for an apparatus 1302' employing a processing system 1414. The processing system 1414 may be implemented with a bus architecture, represented generally by the bus 1424. The bus 1424 may include any number of interconnecting buses and bridges depending on the specific application of the processing system 1414 and the overall design constraints. The bus 1424 links together various circuits including one or more processors and/or hardware modules, represented by the processor 1404, the modules 1304, 1306, 1308, 1310 and the non-transitory computer-readable medium/memory 1406. The bus 1424 may also link various other circuits such as timing sources, peripherals, voltage regulators, and power management circuits, which are well known in the art, and therefore, will not be described any further.

The processing system 1414 may be coupled to a transceiver 1410. The transceiver 1410 is coupled to one or more antennas 1420. The transceiver 1410 provides a means for communicating with various other apparatus over a transmission medium. The transceiver 1410 receives a signal from the one or more antennas 1420, extracts information from the received signal, and provides the extracted information to the processing system 1414, specifically the receiving module 1304. In addition, the transceiver 1410 receives information from the processing system 1414, specifically the LNA gain switching module 1306, and based on the received information, generates a signal to be applied to the one or more antennas 1420. The processing system 1414 includes a processor 1404 coupled to a computer-readable medium/memory 1406. The processor 1404 is responsible for general processing, including the execution of software stored on the computer-readable medium/memory 1406. The software, when executed by the processor 1404, causes the processing system 1414 to perform the various functions described supra for any particular apparatus. The computer-readable medium/memory 1406 may also be used for storing data that is manipulated by the processor 1404 when executing software. The processing system further includes at least one of the modules 1304, 1306, 1308, and 1310. The modules may be software modules running in the processor 1404, resident/stored in the computer readable medium/memory 1406, one or more hardware modules coupled to the processor 1404, or some combination thereof. The processing system 1414 may be a component of the UE 650 and may include the memory 660 and/or at least one of the TX processor 668, the RX processor 656, and the controller/processor 659.

In one configuration, the apparatus 1302/1302' for wireless communication includes means for determining whether a timing offset between a PCC and an SCC possibly exceeds a threshold and means for switching an amplifier gain utilizing one of a first set of gain states or a second set of gain states based on the determination that the timing offset possibly exceeds the threshold. The means for determining whether the timing offset between the PCC and the SCC possibly exceeds the threshold may be configured to determine the timing offset between the PCC and the SCC and to determine whether the timing offset exceeds the threshold. The amplifier gain may be switched utilizing the second set of gain states when the timing offset is greater than the threshold, and may be switched utilizing the first set of gain states when the timing offset is less than the threshold.

The apparatus 1302/1302' for wireless communication may further include means for determining the timing offset between the PCC and the SCC and means for determining whether the timing offset exceeds the threshold. The apparatus 1302/1302' for wireless communication may further include means for receiving an RRC signaling indicating that the PCC and the SCC are through different base stations (e.g., one of the base stations is a repeater). The apparatus 1302/1302' for wireless communication may further include means for determining the timing offset between the PCC and the SCC upon receiving the RRC signaling.

The aforementioned means may be one or more of the aforementioned modules of the apparatus 1302 and/or the processing system 1414 of the apparatus 1302' configured to perform the functions recited by the aforementioned means. As described supra, the processing system 1414 may include the TX Processor 668, the RX Processor 656, and the controller/processor 659. As such, in one configuration, the aforementioned means may be the TX Processor 668, the RX Processor 656, and the controller/processor 659 configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of amplifier gain switching, comprising:
   determining whether a timing offset between a primary component carrier (PCC) and a secondary component carrier (SCC) possibly exceeds a threshold; and
   switching an amplifier gain utilizing one of a first set of gain states or a second set of gain states based on the determination that the timing offset possibly exceeds the threshold, the first set of gain states comprising a first number of gain states and the second set of gain states comprising a second number of gain states less than the first number of gain states.

2. The method of claim 1, wherein the determining whether the timing offset between the PCC and the SCC possibly exceeds the threshold comprises:
   determining the timing offset between the PCC and the SCC; and
   determining whether the timing offset exceeds the threshold,
   wherein the amplifier gain is switched utilizing the second set of gain states when the timing offset is greater than the threshold, and is switched utilizing the first set of gain states when the timing offset is less than the threshold.

3. The method of claim 1, further comprising receiving a radio resource control (RRC) signaling indicating that the PCC and the SCC are through non-collocated base stations or could be subject to a large timing offset, wherein the determining is based at least in part on the received RRC signaling.

4. The method of claim 3, wherein the timing offset is determined to possibly exceed the threshold based on the RRC signaling indicating that the PCC and the SCC are through non-collocated base stations or could be subject to a large timing offset, wherein the amplifier gain is switched utilizing the second set of gain states when said RRC signaling is received, and is switched utilizing the first set of gain states otherwise.

5. The method of claim 3, further comprising:
   determining the timing offset between the PCC and the SCC upon receiving the RRC signaling; and
   determining whether the timing offset exceeds the threshold,
   wherein the amplifier gain is switched utilizing the second set of gain states when the timing offset is greater than the threshold, and is switched utilizing the first set of gain states when the timing offset is less than the threshold.

6. The method of claim 1, wherein the amplifier gain is switched at one or more subframe boundaries of the PCC in a set of frames.

7. The method of claim 1, wherein the threshold is a length of a cyclic prefix in an orthogonal frequency division multiplexing (OFDM) symbol.

8. The method of claim 1, wherein a hysteresis step for switching the amplifier gain utilizing the first set of gain states is less than a hysteresis step for switching the amplifier gain utilizing the second set of gain states.

9. The method of claim 1, wherein the timing offset is a downlink timing offset.

10. The method of claim 1, wherein the first set of gain states includes at least three gain states.

11. An apparatus for wireless communication, comprising:
    means for determining whether a timing offset between a primary component carrier (PCC) and a secondary component carrier (SCC) possibly exceeds a threshold; and
    means for switching an amplifier gain utilizing one of a first set of gain states or a second set of gain states based on the determination that the timing offset possibly exceeds the threshold, the first set of gain states comprising a first number of gain states and the second set of gain states comprising a second number of gain states less than the first number of gain states.

12. The apparatus of claim 11, wherein the means for determining whether the timing offset between the PCC and the SCC possibly exceeds the threshold is configured to:
    determine the timing offset between the PCC and the SCC; and
    determine whether the timing offset exceeds the threshold,
    wherein the amplifier gain is switched utilizing the second set of gain states when the timing offset is greater than the threshold, and is switched utilizing the first set of gain states when the timing offset is less than the threshold.

13. The apparatus of claim 11, further comprising means for receiving a radio resource control (RRC) signaling indicating that the PCC and the SCC are through non-collocated base stations or could be subject to a large timing offset, wherein the determining is based at least in part on the received RRC signaling.

14. The apparatus of claim 13, wherein the timing offset is determined to possibly exceed the threshold based on the RRC signaling indicating that the PCC and the SCC are through non-collocated base stations or could be subject to a large timing offset, wherein the amplifier gain is switched utilizing the second set of gain states when said RRC signaling is received, and is switched utilizing the first set of gain states otherwise.

15. The apparatus of claim 13, further comprising:
    means for determining the timing offset between the PCC and the SCC upon receiving the RRC signaling; and
    means for determining whether the timing offset exceeds the threshold,
    wherein the amplifier gain is switched utilizing the second set of gain states when the timing offset is greater than the threshold, and is switched utilizing the first set of gain states when the timing offset is less than the threshold.

16. The apparatus of claim 11, wherein the amplifier gain is switched at one or more subframe boundaries of the PCC in a set of frames.

17. The apparatus of claim 11, wherein the threshold is a length of a cyclic prefix in an orthogonal frequency division multiplexing (OFDM) symbol.

18. The apparatus of claim 11, wherein a hysteresis step for switching the amplifier gain utilizing the first set of gain states is less than a hysteresis step for switching the amplifier gain utilizing the second set of gain states.

19. The apparatus of claim 11, wherein the timing offset is a downlink timing offset.

20. An apparatus for wireless communication, comprising:
    a memory; and
    at least one processor coupled to the memory and configured to:
    determine whether a timing offset between a primary component carrier (PCC) and a secondary component carrier (SCC) possibly exceeds a threshold; and
    switch an amplifier gain utilizing one of a first set of gain states or a second set of gain states based on the determination that the timing offset possibly exceeds the threshold, the first set of gain states comprising a first number of gain states and the second set of gain states comprising a second number of gain states less than the first number of gain states.

21. The apparatus of claim 20, wherein the at least one processor is configured to determine whether the timing offset between the PCC and the SCC possibly exceeds the threshold by:
   determining the timing offset between the PCC and the SCC; and
   determining whether the timing offset exceeds the threshold,
   wherein the amplifier gain is switched utilizing the second set of gain states when the timing offset is greater than the threshold, and is switched utilizing the first set of gain states when the timing offset is less than the threshold.

22. The apparatus of claim 20, wherein the at least one processor is further configured to receive a radio resource control (RRC) signaling indicating that the PCC and the SCC are through non-collocated base stations or could be subject to a large timing offset, wherein the determining is based at least in part on the received RRC signaling.

23. The apparatus of claim 22, wherein the timing offset is determined to possibly exceed the threshold based on the RRC signaling indicating that the PCC and the SCC are through non-collocated base stations or could be subject to a large timing offset, wherein the amplifier gain is switched utilizing the second set of gain states when said RRC signaling is received, and is switched utilizing the first set of gain states otherwise.

24. The apparatus of claim 22, wherein the at least one processor is further configured to:
   determine the timing offset between the PCC and the SCC upon receiving the RRC signaling; and
   determine whether the timing offset exceeds the threshold, wherein the amplifier gain is switched utilizing the second set of gain states when the timing offset is greater than the threshold, and is switched utilizing the first set of gain states when the timing offset is less than the threshold.

25. The apparatus of claim 20, wherein the amplifier gain is switched at one or more subframe boundaries of the PCC in a set of frames.

26. The apparatus of claim 20, wherein the threshold is a length of a cyclic prefix in an orthogonal frequency division multiplexing (OFDM) symbol.

27. The apparatus of claim 20, wherein a hysteresis step for switching the amplifier gain utilizing the first set of gain states is less than a hysteresis step for switching the amplifier gain utilizing the second set of gain states.

28. The apparatus of claim 20, wherein the timing offset is a downlink timing offset.

29. The apparatus of claim 20, wherein the first set of gain states includes at least three gain states.

30. A non-transitory computer-readable medium comprising code that when executed on at least one processor causes the at least one processor to:
   determine whether a timing offset between a primary component carrier (PCC) and a secondary component carrier (SCC) possibly exceeds a threshold; and
   switch an amplifier gain utilizing one of a first set of gain states or a second set of gain states based on the determination that the timing offset possibly exceeds the threshold, the first set of gain states comprising a first number of gain states and the second set of gain states comprising a second number of gain states less than the first number of gain states.

* * * * *